US012670843B2

(12) United States Patent
Yu et al.

(10) Patent No.: US 12,670,843 B2
(45) Date of Patent: Jun. 30, 2026

(54) ARRAY SUBSTRATE, DISPLAY PANEL AND DISPLAY DEVICE

(71) Applicant: Wuhan Tianma Microelectronics Co., Ltd., Wuhan (CN)

(72) Inventors: Chao Yu, Wuhan (CN); Fei Li, Wuhan (CN)

(73) Assignee: Wuhan Tianma Microelectronics Co., Ltd., Wuhan (CN)

( * ) Notice: Subject to any disclaimer, the term of this patent is extended or adjusted under 35 U.S.C. 154(b) by 483 days.

(21) Appl. No.: 18/223,792

(22) Filed: Jul. 19, 2023

(65) Prior Publication Data

US 2023/0368727 A1 Nov. 16, 2023

(30) Foreign Application Priority Data

Mar. 1, 2023 (CN) .......................... 202310206361.0

(51) Int. Cl.
| | |
|---|---|
| *G09G 3/32* | (2016.01) |
| *G09G 3/3233* | (2016.01) |
| *H10D 86/40* | (2025.01) |
| *H10D 86/60* | (2025.01) |
| *H10K 59/131* | (2023.01) |

(52) U.S. Cl.
CPC ............. *G09G 3/32* (2013.01); *G09G 3/3233* (2013.01); *H10D 86/441* (2025.01); *H10D 86/60* (2025.01); *H10K 59/131* (2023.02); *G09G 2300/0426* (2013.01); *G09G 2300/0819* (2013.01); *G09G 2300/0842* (2013.01); *G09G 2300/0861* (2013.01); *G09G 2310/0267* (2013.01)

(58) Field of Classification Search
CPC .................. G09G 3/32; G09G 3/3233; G09G 2300/0426; G09G 2300/0819; G09G 2300/0842; G09G 2300/0861; G09G 2310/0267; H10K 59/131; H10D 86/441; H10D 86/60
USPC ......................................................... 349/139
See application file for complete search history.

(56) References Cited

U.S. PATENT DOCUMENTS

2025/0148975 A1* 5/2025 Zhao .................... G09G 3/3233

FOREIGN PATENT DOCUMENTS

| CN | 113471264 A | 10/2021 |
|---|---|---|
| CN | 115050339 A | 9/2022 |

* cited by examiner

*Primary Examiner* — Jerry M Blevins
(74) *Attorney, Agent, or Firm* — KDW FIRM PLLC

(57) ABSTRACT

Provided are an array substrate, a display panel, and a display device. The array substrate includes a substrate, multiple pixel driving circuits, and multiple signal lines; a pixel driving circuit of the multiple pixel driving circuits includes a drive transistor and a regulating transistor, the multiple signal lines include a scan signal line, a regulating signal line, and a power signal line, and the scan signal line includes a regulating control signal line; a first electrode of the drive transistor is electrically connected to a power signal line; a first electrode of the regulating transistor is electrically connected to the regulating signal line, a second electrode of the regulating transistor is electrically connected to the first electrode of the drive transistor or a second electrode of the drive transistor, and the gate of the regulating transistor is electrically connected to the regulating control signal line.

30 Claims, 34 Drawing Sheets

POLY

P

Y

X

POLY

ARRAY SUBSTRATE, DISPLAY PANEL AND DISPLAY DEVICE

CROSS-REFERENCE TO RELATED APPLICATION

This application claims priority to Chinese patent application No. 202310206361.0 filed with the CNIPA on Mar. 1, 2023, the disclosure of which is incorporated herein by reference in its entirety.

TECHNICAL FIELD

The present disclosure relates to the field of display technologies, and in particular, an array substrate, a display panel, and a display device.

BACKGROUND

In existing display panel technologies, two mainstreams: liquid crystal display panels and organic self-luminous display panels are mainly divided. Here, a liquid crystal display panel applies voltages to a pixel electrode and a common electrode in the display panel to form an electric field capable of controlling liquid crystal molecules to deflect, and then controls the transmission of light to achieve the display function of the display panel. The organic self-luminous display panel uses an organic electroluminescent material, and when a current passes through the organic electroluminescent material, the light-emitting material emits light, thereby achieving the display function of the display panel.

With the application of display technologies in smart wearable devices and other portable electronic devices, the design of electronic products constantly pursues smooth user experience and meanwhile, also increasingly pursues users' sensory experience, for example, the performance of wide viewing angle, high resolution, narrow bezel, high screen-to-body ratio and the like becomes selling points of various electronic products.

SUMMARY

The present disclosure provides an array substrate, a display panel, and a display resolution to reduce the size of pixel drive circuits in the second direction and improve the display resolution.

An embodiment of the present disclosure provide an array substrate. The array substrate includes a substrate, multiple pixel driving circuits and multiple signal lines. The multiple pixel driving circuits and the multiple signal lines are located on the same side of the substrate.

A pixel driving circuit of the multiple pixel driving circuits includes a drive transistor and a regulating transistor. The multiple signal lines include a scan signal line, a regulating signal line, and a power signal line. The scan signal line includes a regulating control signal line.

A first electrode of the drive transistor is electrically connected to the power signal line.

A first electrode of the regulating transistor is electrically connected to the regulating signal line. A second electrode of the regulating transistor is electrically connected to the first electrode of the drive transistor or a second electrode of the drive transistor. A gate of the regulating transistor is electrically connected to the regulating control signal line.

The scan signal line extends in a first direction. The regulating signal line extends in a second direction. The regulating signal line is disposed in a layer different from a layer where the scan signal line is disposed. The first direction and the second direction intersect each other.

An embodiment of the present disclosure provides a display panel. The display panel includes the array substrate described in the above-mentioned embodiment, and multiple light-emitting elements disposed on the array substrate.

An embodiment of the present disclosure provides a display device. The display device includes the display panel described in the above-mentioned embodiment.

DETAILED DESCRIPTION

Figure 1:
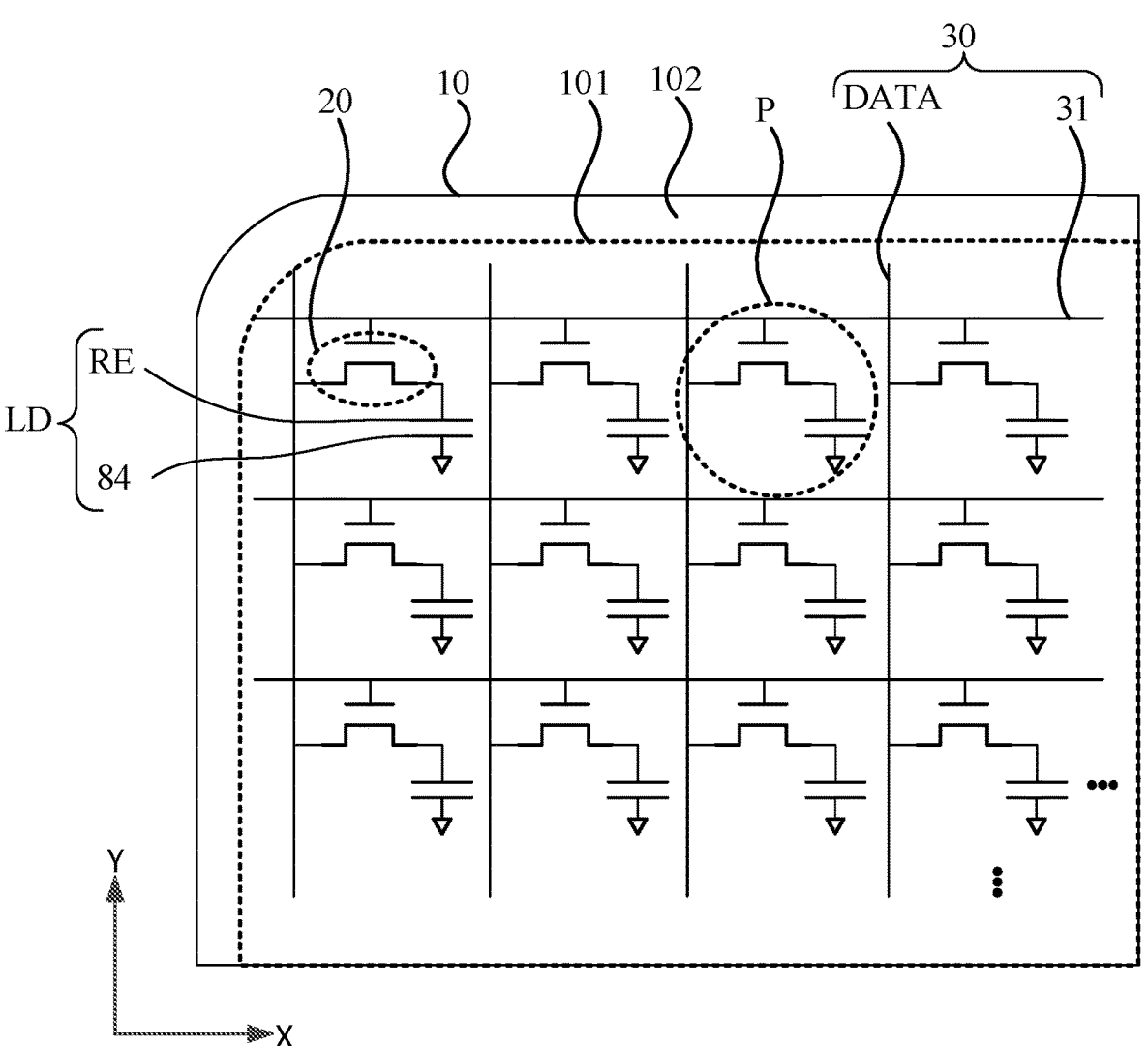
FIG. 1 is a top view of an array substrate according to an embodiment of the present disclosure.

The present disclosure will be described hereinafter in detail with reference to the accompanying drawings and embodiments. It is to be understood that the embodiments described herein are intended to explain the present disclosure and not to limit the present disclosure. Additionally, it is to be noted that for ease of description, only part, not all, of the structures related to the present disclosure are illustrated in the drawings.

Figure 2:
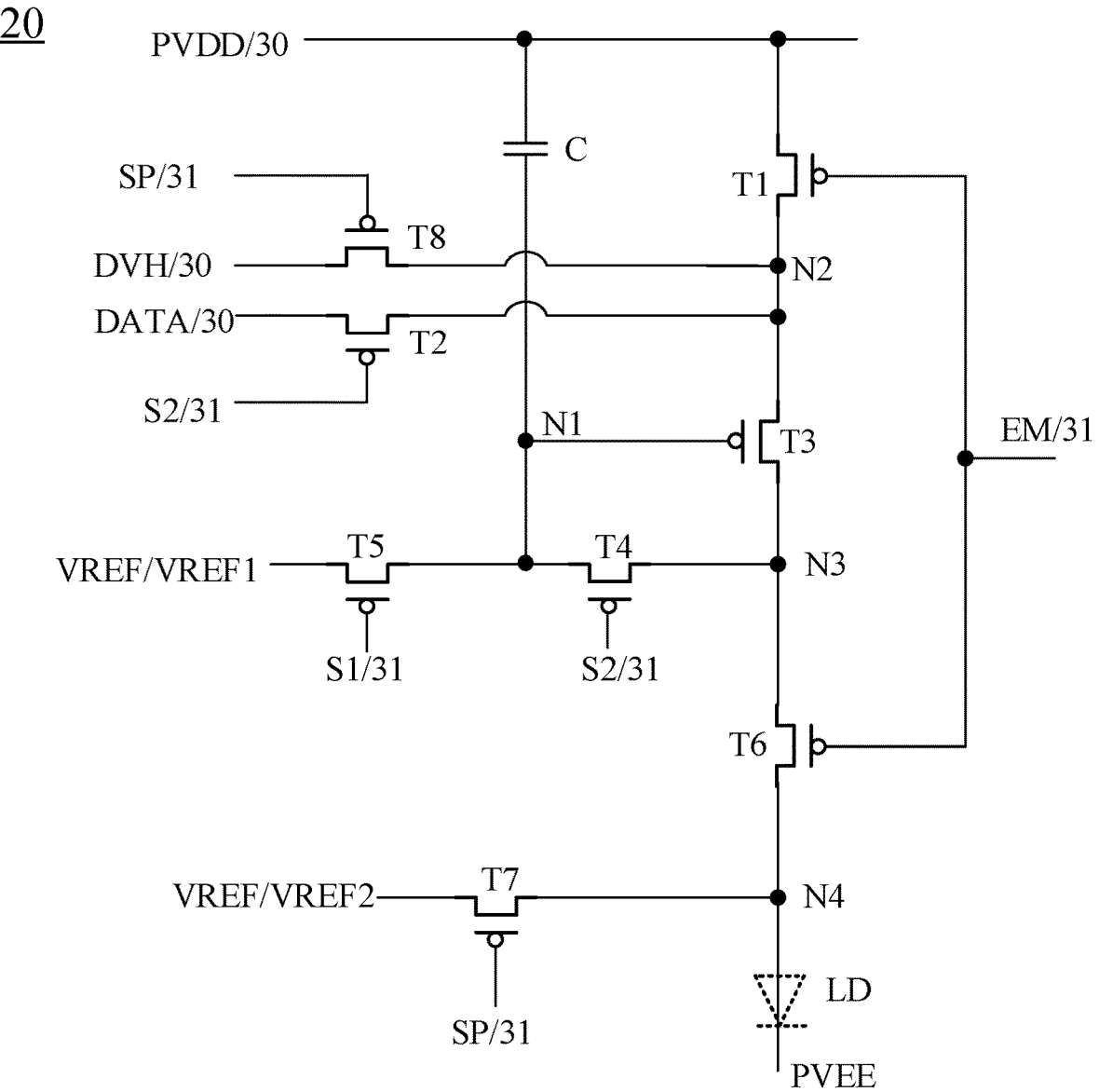
FIG. 2 is a circuit diagram of a pixel driving circuit according to an embodiment of the present disclosure.
Figure 3:
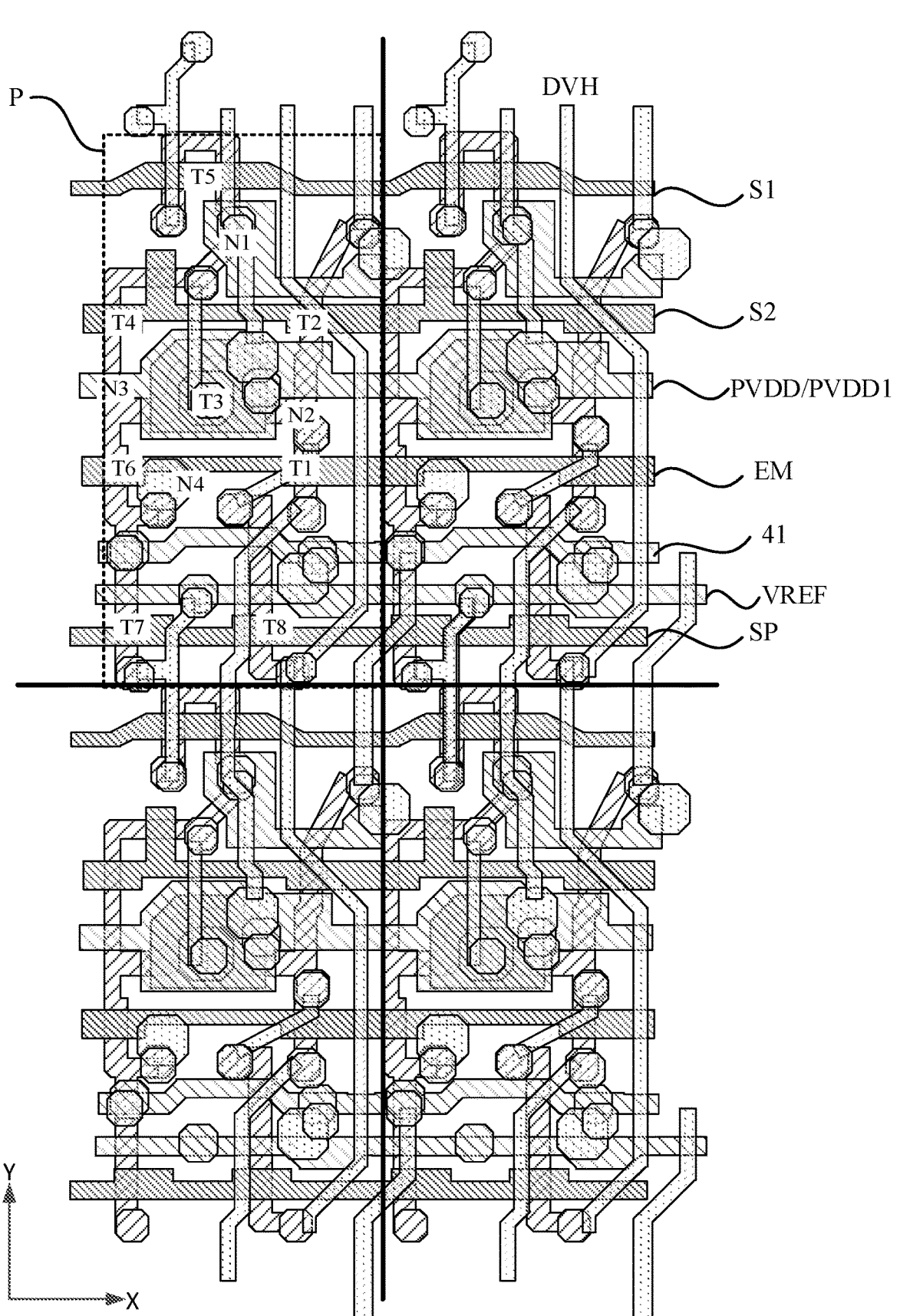
FIG. 3 is a top view of a pixel driving circuit according to an embodiment of the present disclosure.
Figure 4:
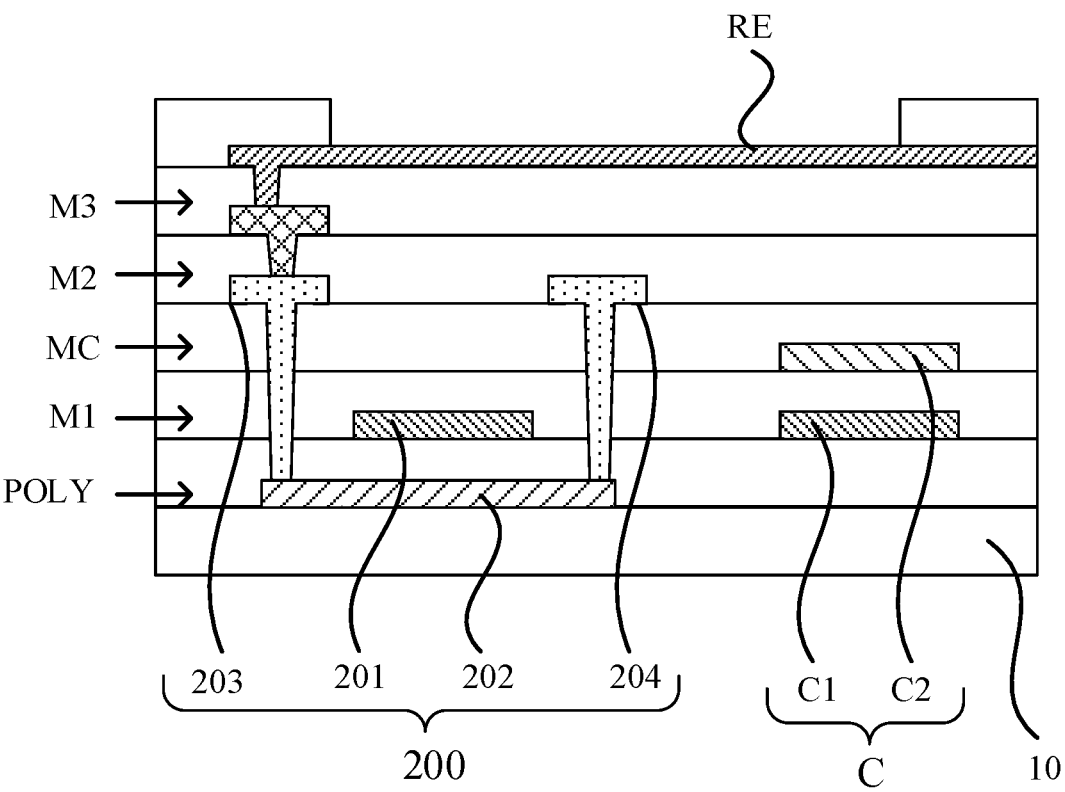
FIG. 4 is a sectional view of a pixel driving circuit according to an embodiment of the present disclosure.

FIG. 1 is a top view of an array substrate according to an embodiment of the present disclosure. FIG. 2 is a circuit diagram of a pixel driving circuit according to an embodiment of the present disclosure. FIG. 3 is a top view of a pixel driving circuit according to an embodiment of the present disclosure. FIG. 4 is a sectional view of a pixel driving circuit according to an embodiment of the present disclosure. Referring to FIGS. 1 to 4, the array substrate includes a substrate 10, multiple pixel driving circuits 20, and multiple signal lines 30. The multiple pixel driving circuits 20 and multiple signal lines 3 are located on the same side of the substrate 10. A signal line 30 is configured to provide at least one of a voltage signal or a current signal to a pixel driving circuit 20.

The pixel driving circuit 20 includes multiple thin-film transistors 200. The multiple thin-film transistors 200 include a drive transistor T3 and a regulating transistor T8. The signal line 30 includes a scan signal line 31, a regulating signal line DVH, and a power signal line PVDD. The scan signal line 31 is configured to provide a scan signal to the pixel driving circuit 20 for controlling the thin-film transistors 200 to be turned on or cutoff in the pixel driving circuit 20. The scan signal line 31 includes a regulating control signal line SP.

A first electrode of the drive transistor T3 is electrically connected to a power signal line PVDD. The first electrode of the drive transistor T3 may be directly electrically connected to the power signal line PVDD, or the first electrode of the drive transistor T3 may be indirectly electrically connected to the power signal line PVDD after passing through elements such as a thin-film transistor, a capacitor, and the like.

A first electrode of the regulating transistor T8 is electrically connected to the regulating signal line DVH. A second electrode of the regulating transistor T8 is electrically connected to the first electrode of the drive transistor T3 or a second electrode of the drive transistor T3 (FIG. 2 exemplarily shows that the second electrode of the regulating transistor T8 is electrically connected to the first electrode of the drive transistor T3). The gate of the regulating transistor T8 is electrically connected to the regulating control signal line SP. When the regulating control signal line SP controls the regulating transistor T8 to be turned on, it is possible to transmit a regulating signal transmitted on the regulating signal line DVH to the first electrode of the drive transistor T3 to reset a second node N2, improving the brightness of the first frame, and avoiding the excessive low brightness of the first frame.

The scan signal line 31 extends in a first direction X. The regulating signal line DVH extends in a second direction Y. Moreover, the regulating signal line DVH and the scan signal lines 31 are disposed in different layers. The regulating signal line DVH and the scan signal lines 31 are disposed in different metal layers. The first direction X and the second direction Y intersect each other. In one embodiment, the first direction X is perpendicular to the second direction Y. In another embodiment, the first direction X is not perpendicular to the second direction Y, and the first direction X and the second direction Y have an included angle greater than 0° and less than 90°.

Embodiments of the present disclosure provide an array substrate. The extension direction of the scan signal line 31 is different from the extension direction of the regulating signal line DVH. The scan signal line 31 extends in the first direction X. The regulating signal line DVH extends in the second direction Y. It is to be understood that, for multiple signal lines 30 extending in the first direction X and arranged in the second direction Y, it is needed to leave a certain space between two adjacent signal lines 30 in the second direction Y. The more signal lines 30 arranged in the second direction Y, the larger the space occupied in the second direction Y. In the embodiments of the present disclosure, the regulating signal line DVH extends in the second direction Y and not extend in the first direction X, so the regulating signal line DVH does not occupy the arrangement space in the second direction Y, thereby reducing the size of the pixel driving circuits 20 in the second direction Y, facilitating increasing the pixel density (i.e., the number of pixels per inch) and improving the display resolution.

Exemplarily, referring to FIG. 2, the pixel driving circuit 20 includes multiple thin-film transistors 200. The multiple thin-film transistors 200 include a power write transistor T1, a data write transistor T2, a drive transistor T3, a compensation transistor T4, a first reset transistor T5, a light-emitting control transistor T6, a second reset transistor T7, and a regulating transistor T8. The pixel driving circuit 20 further includes a storage capacitor C. A first electrode of the power write transistor T1 is electrically connected to the power signal line PVDD. A second electrode of the power write transistor T1 is electrically connected to the second node N2. The gate of the power write transistor T1 is electrically connected to a light-emitting control scan signal line EM. A first electrode of the data write transistor T2 is electrically connected to a data line DATA. A second electrode of the data write transistor T2 is electrically connected to the second node N2. The gate of the data write transistor T2 is electrically connected to a second scan signal line S2. The first electrode of the drive transistor T3 is electrically connected to the second node N2. The second electrode of the drive transistor T3 is electrically connected to a third node N3. The gate of the drive transistor T3 is electrically connected to a first node N1. A first electrode of the compensation transistor T4 is electrically connected to the first node N1. A second electrode of the compensation transistor T4 is electrically connected to the third node N3. The gate of the compensation transistor T4 is electrically connected to the second scan signal line S2. A first electrode of the first reset transistor T5 is electrically connected to a reset signal line VREF (for example, a first reset signal line VREF1). A second electrode of the first reset transistor T5 is electrically connected to the first node N1. The gate of the first reset transistor T5 is electrically connected to a first scan signal line S1. A first electrode of the light-emitting control transistor T6 is electrically connected to the third node N3. A second electrode of the light-emitting control transistor T6 is electrically connected to a fourth node N4. The gate of the light-emitting control transistor T6 is electrically connected to the light-emitting control scan signal line EM. A first electrode of the second reset transistor T7 is electrically connected to a reset signal line VREF (for example, a second reset signal line VREF2). A second electrode of the second reset transistor T7 is electrically connected to the fourth node N4. The gate of the second reset transistor T7 is electrically connected to the regulating control signal line SP. A first electrode of the regulating transistor T8 is electrically connected to the regulating signal line DVH. A second electrode of the regulating transistor T8 is electrically connected to the second node N2. The gate of the regulating transistor T8 is electrically connected to the regulating control signal line SP. A first plate C1 of the storage capacitor C is electrically connected to the first node N1. A second plate C2 of the storage capacitor C is electrically connected to the power signal line PVDD.

The first node N1, the second node N2, the third node N3, and the fourth node N4 may be virtually existing connection nodes or actually existing connection nodes.

It is to be noted that the circuit diagram shown in FIG. 2 is only one example, and is not intended to limit the present disclosure. In other embodiments, the pixel driving circuit 20 may also have another circuit structure. In the pixel driving circuit shown in FIG. 3, the first reset signal line VREF1 and the second reset signal line VREF2 transmit the same signal. That is, one reset signal is used to reset the first node N1 and the fourth node N4. In other embodiments, the first reset signal line VREF1 and the second reset signal line VREF2 may transmit different signals. The reset voltage of the first node N1 may not be equal to the reset voltage of the fourth node N4.

Exemplarily, referring to FIGS. 2 and 3, the scan signal lines 31 include a light-emitting control scan signal line EM, a first scan signal lines S1, a second scan signal line S2, and a regulating control signal line SP. The signal lines 30 further include a reset signal line VREF. The reset signal line VREF includes at least one of the first reset signal line VREF1 or the second reset signal line VREF2. The reset signal line VREF extends in the first direction X. The power signal line PVDD includes a first power signal line PVDD1 extending in the first direction X. The number of signal lines 30 extending in the first direction X is relatively large, so the regulating signal line DVH is set to extend in the second direction Y, reducing the size of the pixel driving circuits 20 in the second direction Y, and improving the display resolution.

Figure 5:
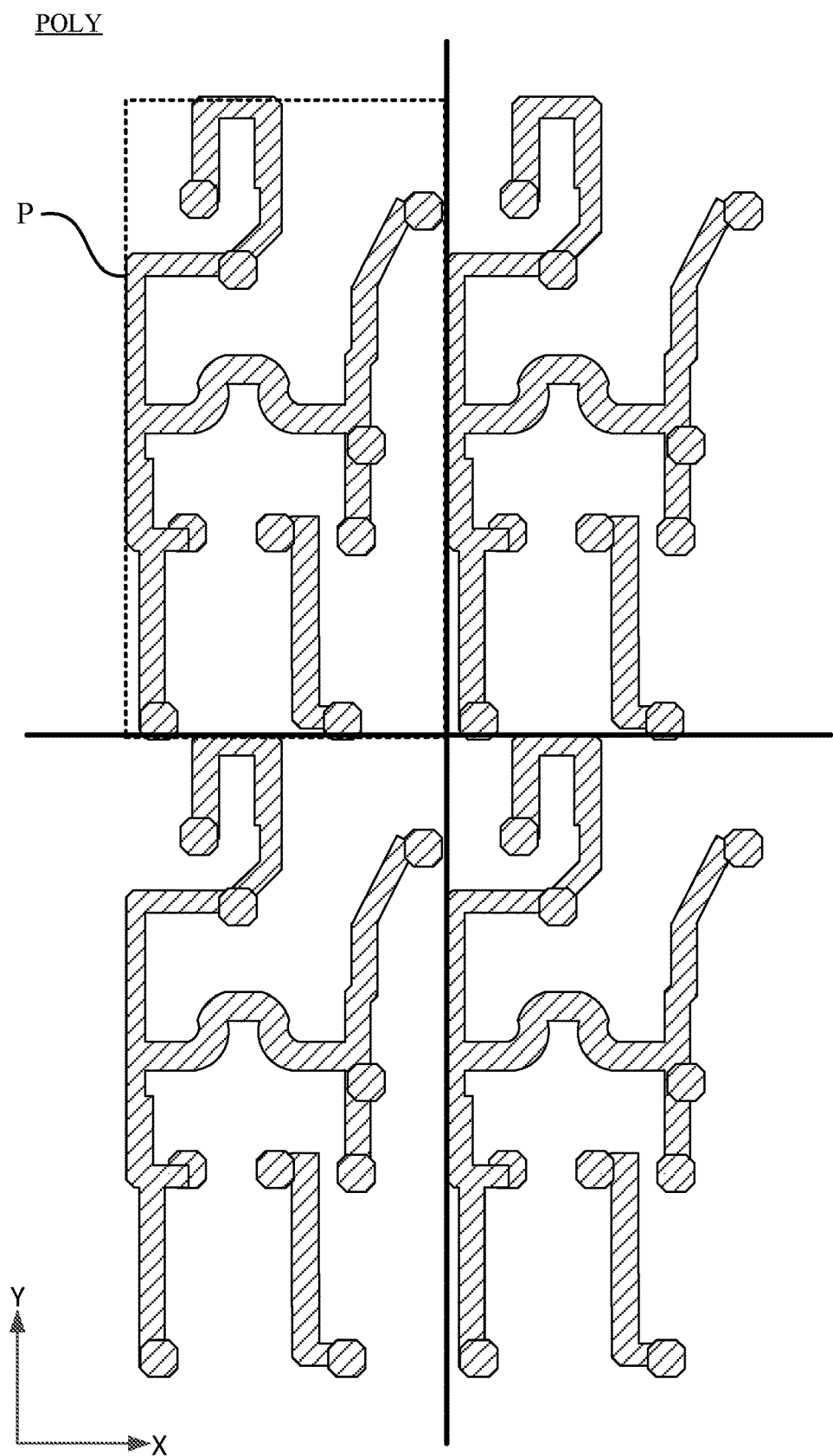
FIG. 5 is a top view of a silicon semiconductor layer according to an embodiment of the present disclosure.
Figure 6:
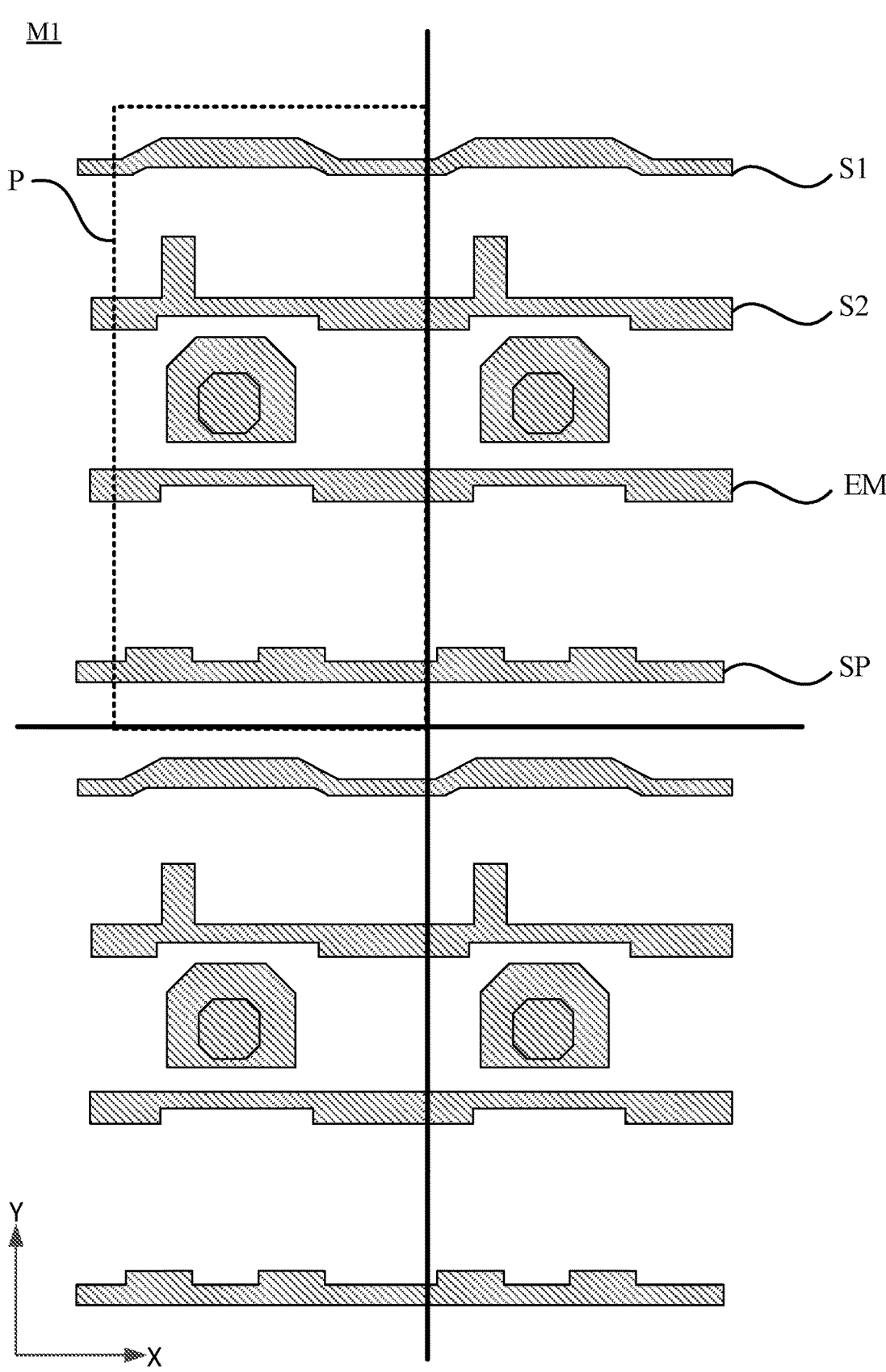
FIG. 6 is a top view of a first metal layer according to an embodiment of the present disclosure.
Figure 7:
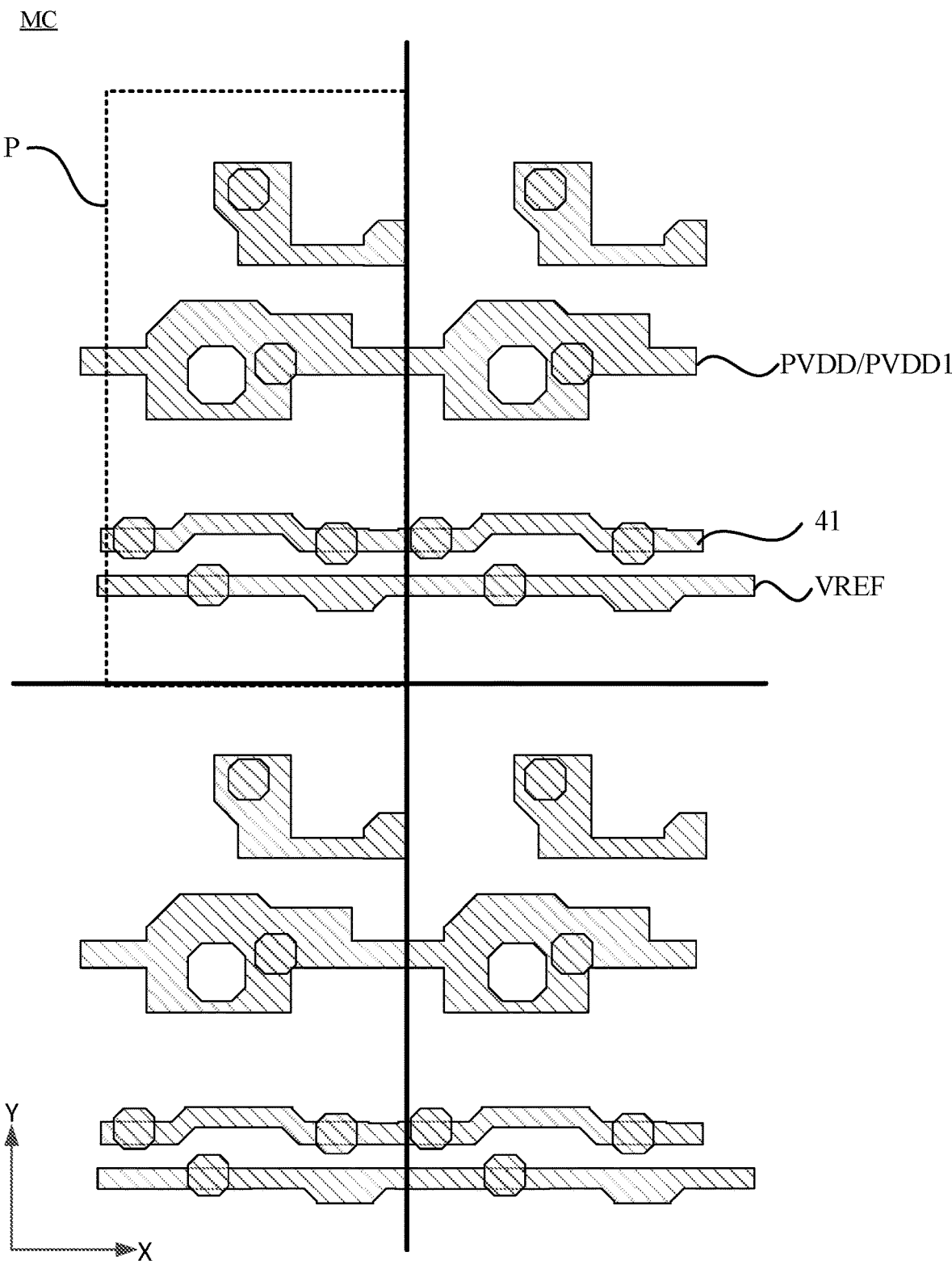
FIG. 7 is a top view of a capacitor metal layer according to an embodiment of the present disclosure.
Figure 8:
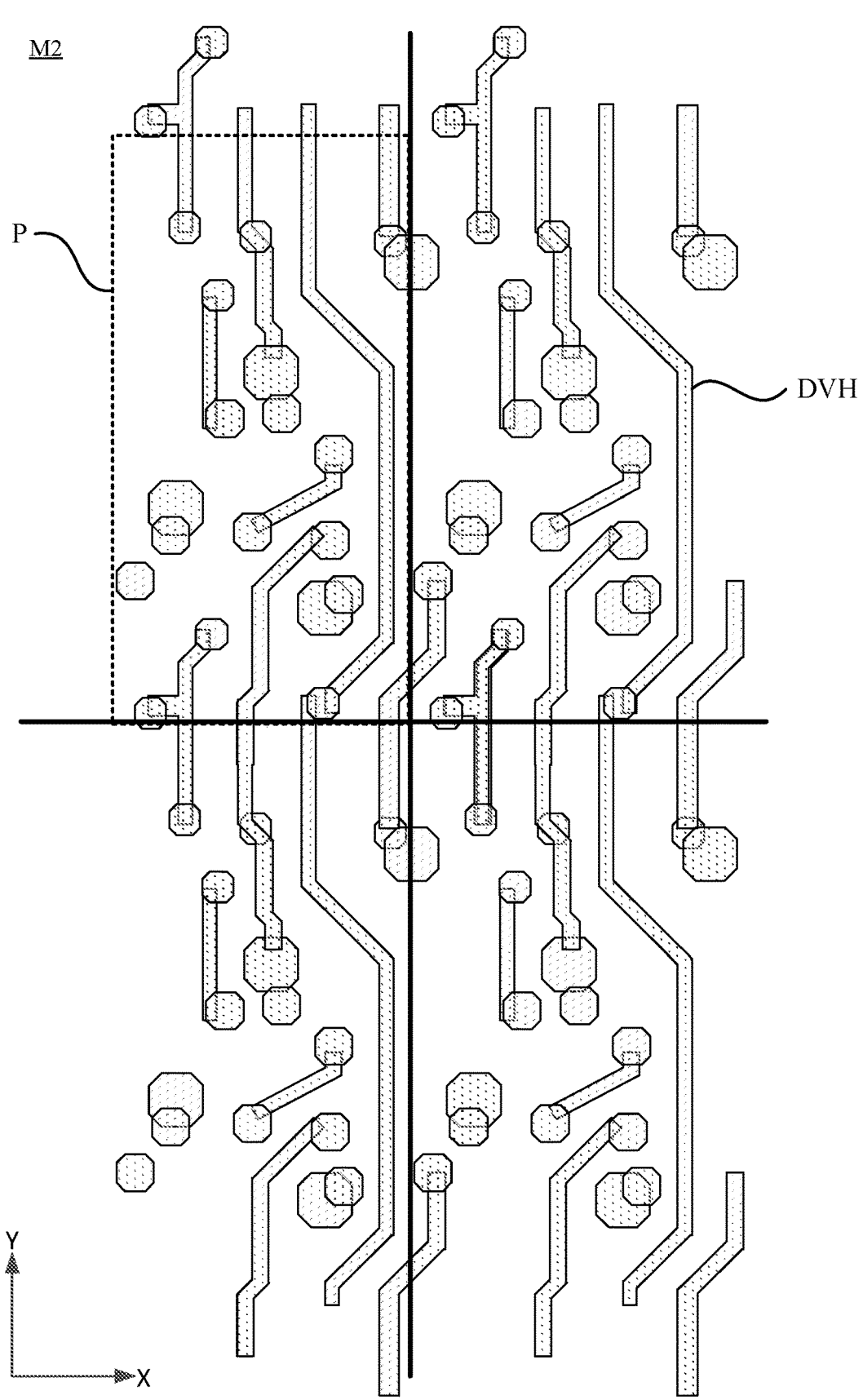
FIG. 8 is a top view of a second metal layer according to an embodiment of the present disclosure.

In the field of display technologies, devices such as the thin-film transistor 200 and the storage capacitor C in the pixel driving circuit 20 are all implemented by stacking films. For the sake of clarity, in embodiments of the present disclosure, the pixel driving circuit 20 shown in FIG. 3 is also described by splitting the films. FIG. 5 is a top view of a silicon semiconductor layer according to an embodiment of the present disclosure. FIG. 6 is a top view of a first metal layer according to an embodiment of the present disclosure. FIG. 7 is a top view of a capacitor metal layer according to an embodiment of the present disclosure. FIG. 8 is a top view of a second metal layer according to an embodiment of the present disclosure. Referring to FIGS. 2 to 8, the array substrate includes a silicon semiconductor layer POLY, a first metal layer M1, a capacitor metal layer MC, and a second metal layer M2 that are sequentially stacked. The silicon semiconductor layer POLY is located between the substrate 10 and the first metal layer M1. The silicon semiconductor layer POLY includes silicon. The thin-film transistor 200 includes a gate 201, a channel layer 202, a source 203, and a drain 204. The gate 201 is located in the first metal layer M1. The channel layer 202 is located in the silicon semiconductor layer POLY. The source 203 and the drain 204 are both located in the second metal layer M2. In other embodiments, the channel layer 202 in the thin-film transistor 200 may include an oxide semiconductor material. The type of the thin-film transistor 200 is not limited in embodiments of the present disclosure. The storage capacitor C includes the first plate C1 and the second plate C2. The first plate C1 is located between the second plate C2 and the substrate 10. The first plate C1 is located in the first metal layer M1 and the second plate C2 is located in the capacitor metal layer MC.

Exemplarily, referring to FIGS. 1 to 4, the scan signal line 31 is located in the first metal layer M1. The first power signal line PVDD1 is located in the capacitor metal layer MC. The signal lines 30 further include a data line DATA extending in the second direction Y. A film where a data line DATA is disposed is located on a side of a film where the scan signal line 31 is disposed, which faces away from the substrate 10. A film where the regulating signal line DVH is disposed is located on a side, away from the substrate 10, of the film where the scan signal line 31 is disposed.

Figure 9:
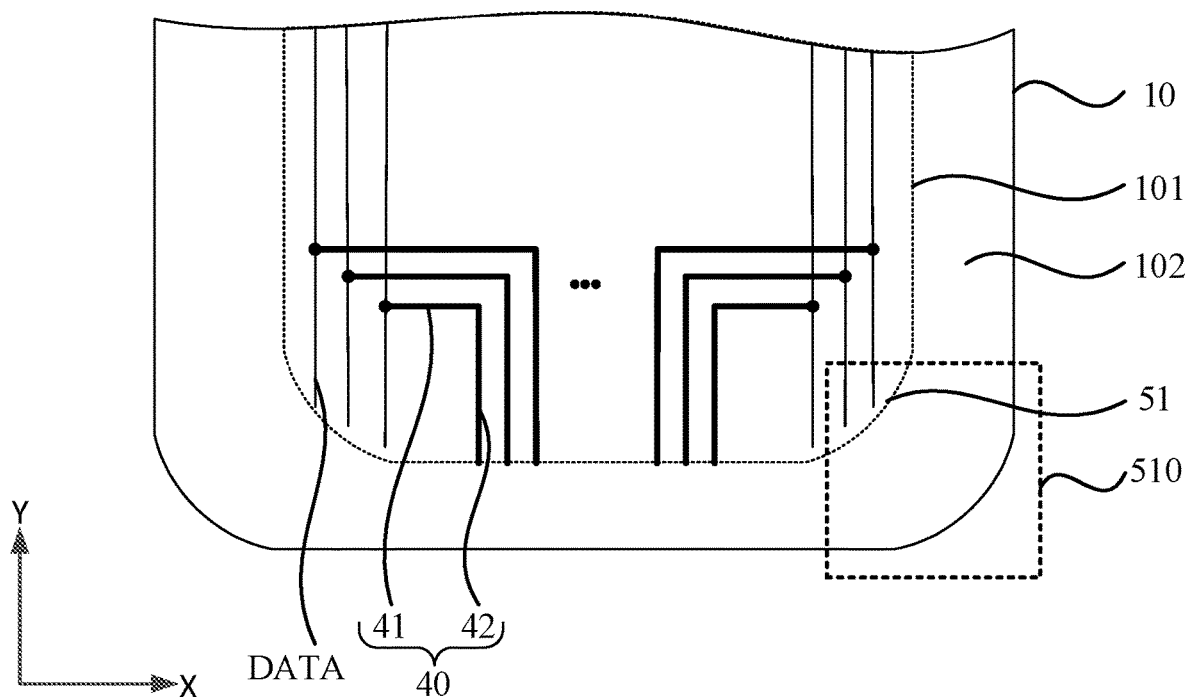
FIG. 9 is a top view of another array substrate according to an embodiment of the present disclosure.
Figure 10:
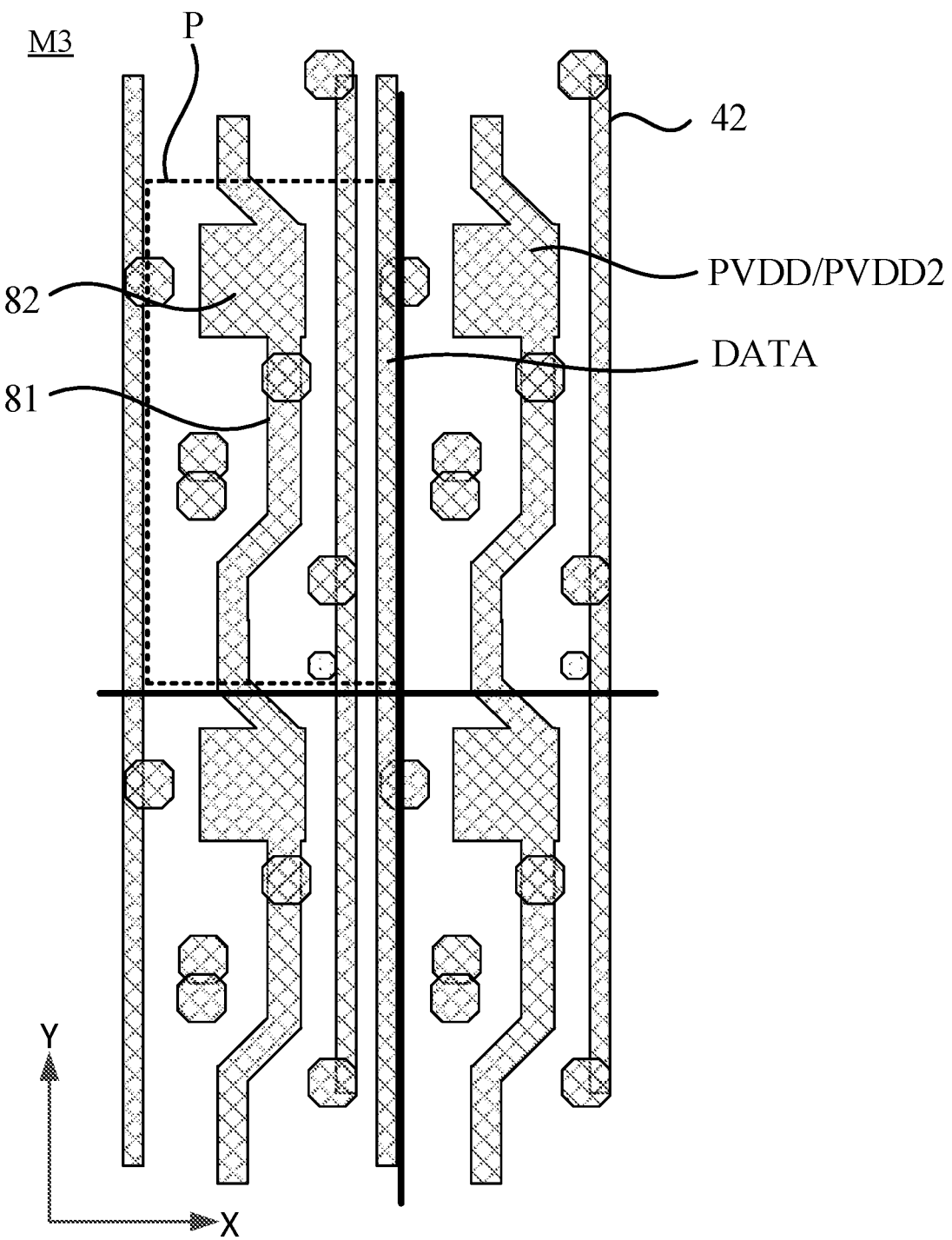
FIG. 10 is a top view of a third metal layer according to an embodiment of the present disclosure.
Figure 11:
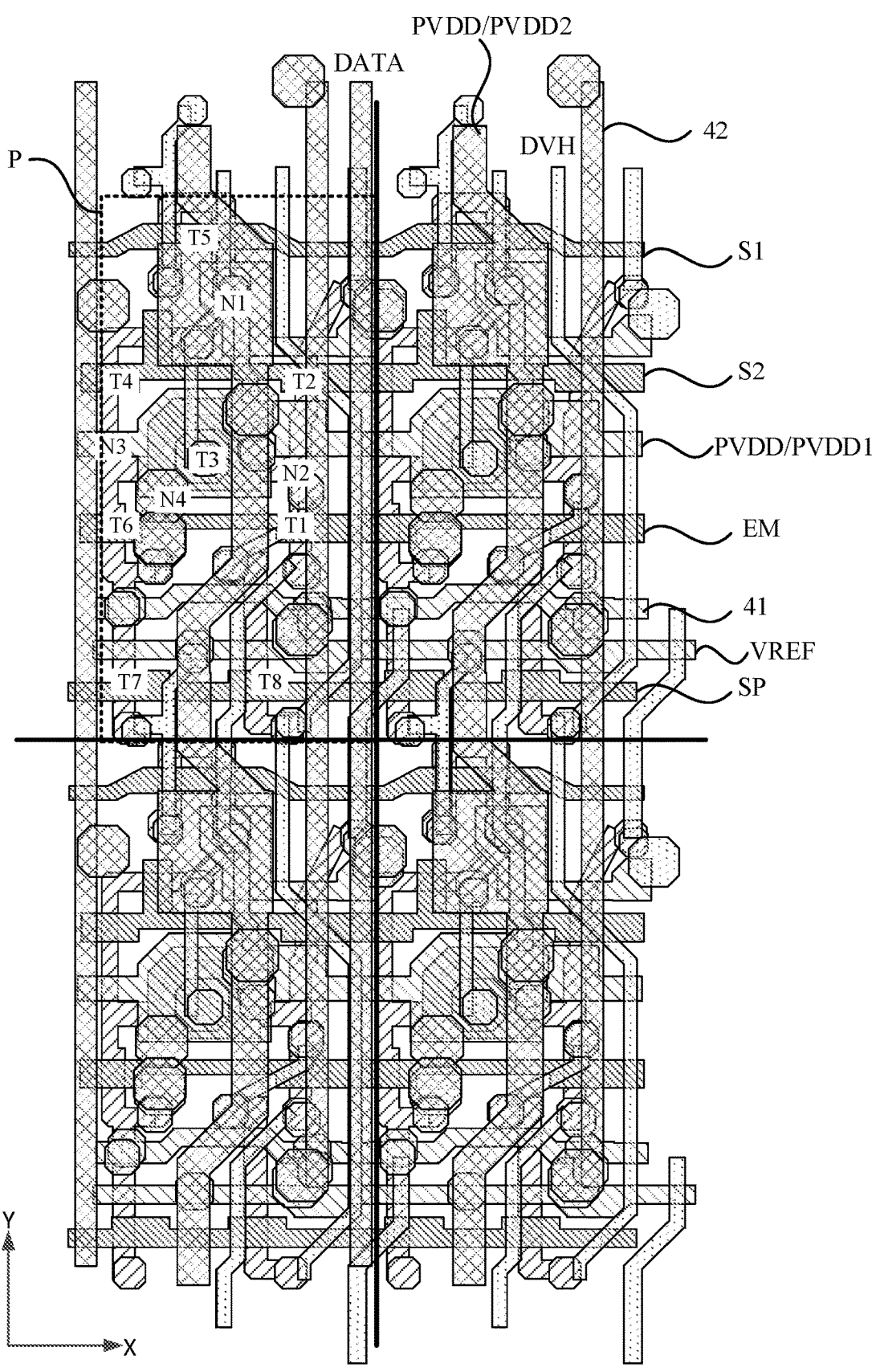
FIG. 11 is a top view of another pixel driving circuit according to an embodiment of the present disclosure.
Figure 12:
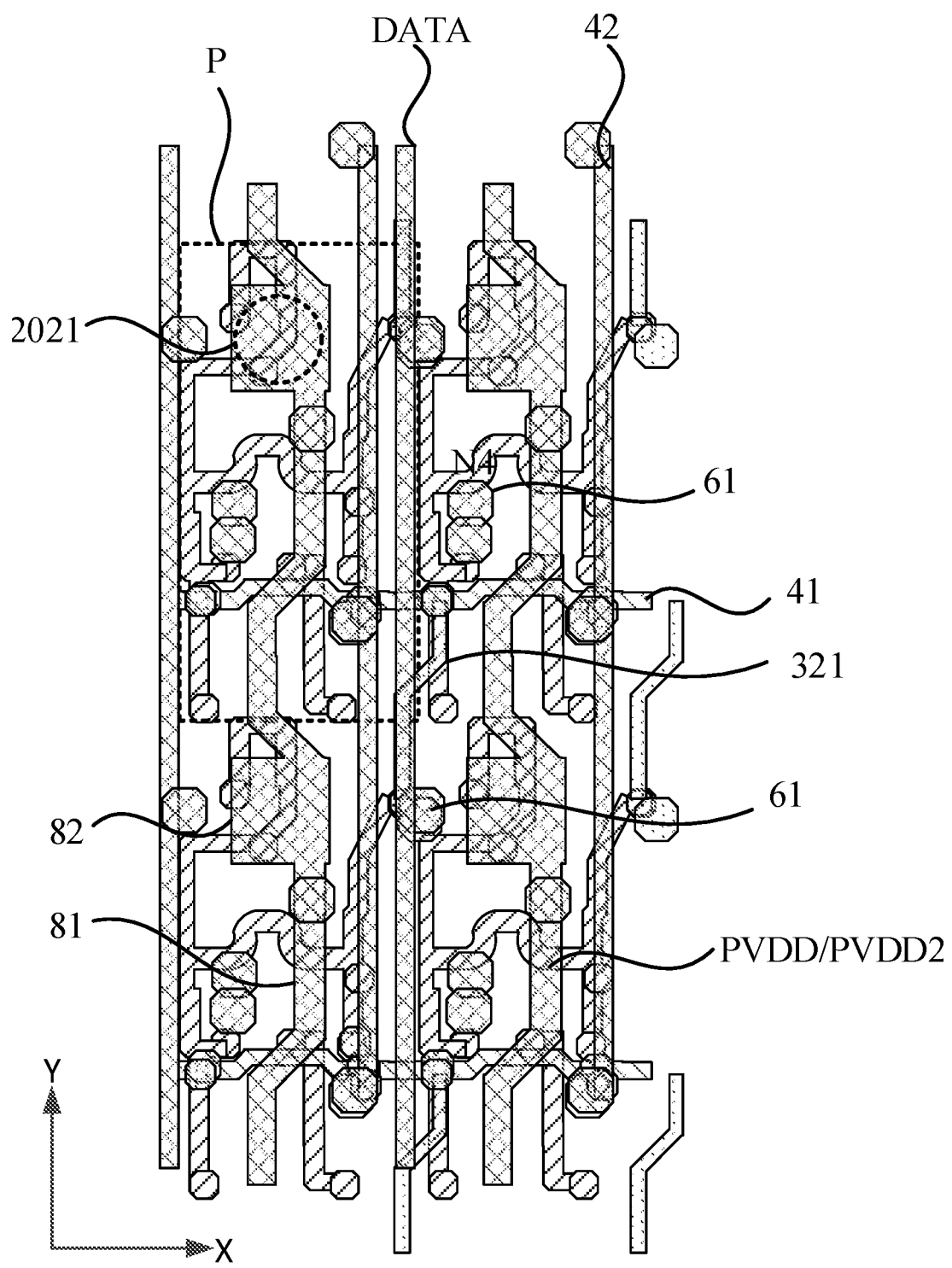
FIG. 12 is a view of a portion of the structure of the pixel driving circuit of FIG. 11.
Figure 13:
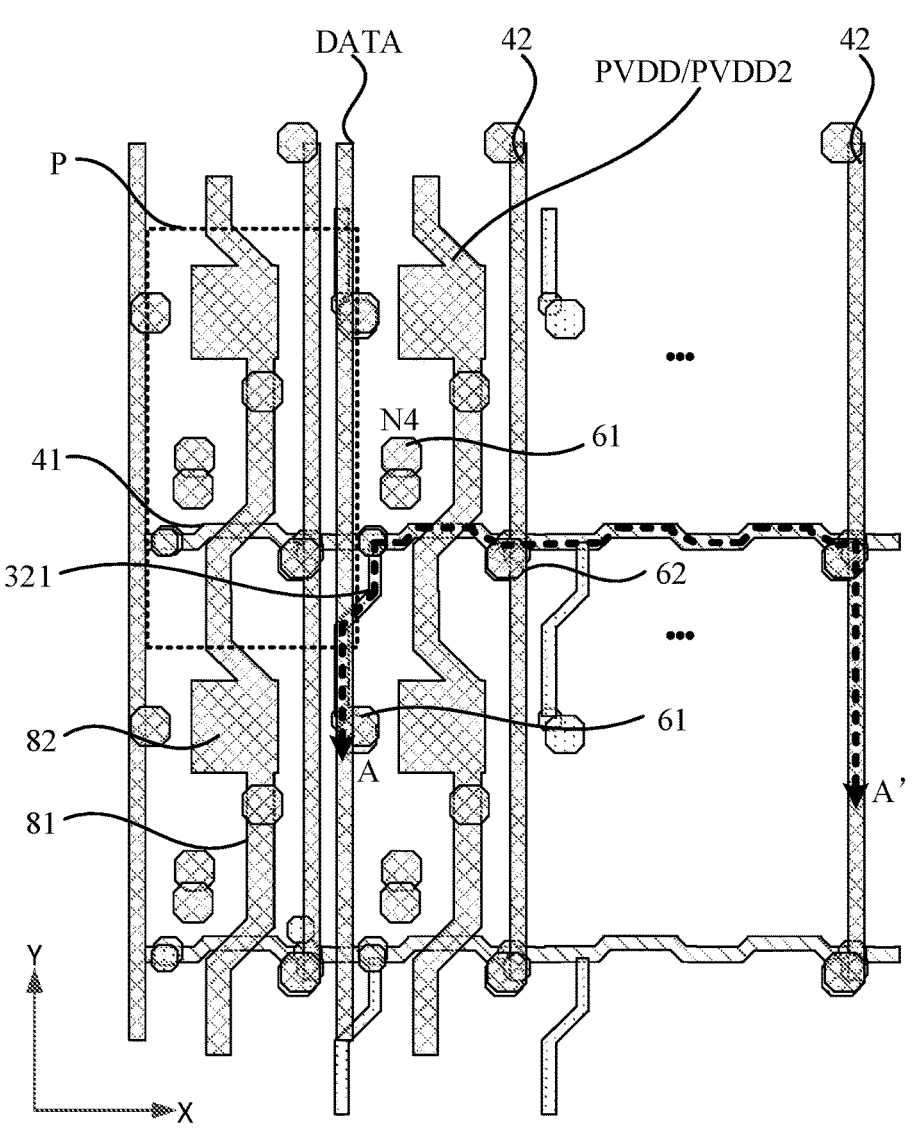
FIG. 13 is a top view of another pixel driving circuit according to an embodiment of the present disclosure.
Figure 14:
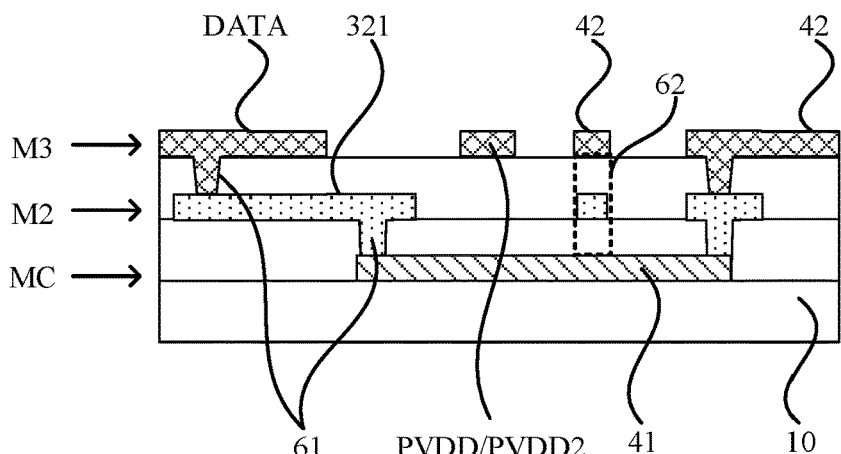
FIG. 14 is a sectional view taken along AA' of FIG. 13.

FIG. 9 is a top view of another array substrate according to an embodiment of the present disclosure. FIG. 10 is a top view of a third metal layer according to an embodiment of the present disclosure. FIG. 11 is a top view of another pixel driving circuit according to an embodiment of the present disclosure. FIG. 11 is a top view of another pixel driving circuit formed by stacking the third metal layer shown in FIG. 10 on the basis of FIG. 3. FIG. 12 is a view of a portion of the structure of the pixel driving circuit of FIG. 11. FIG. 13 is a top view of another pixel driving circuit according to an embodiment of the present disclosure. FIG. 14 is a sectional view taken along AA' of FIG. 13. Referring to FIGS. 9 to 14, the array substrate further includes a connection line 40. The connection line 40 includes a first connection line 41 and a second connection line 42. The first connection line 41 is electrically connected to the second connection line 42. The first connection line 41 extends in the first direction X. The second connection line 42 extends in the second direction Y. The first connection line 41 connects the data line DATA and the second connection line 42. The connection line 40 is configured to connect the data line DATA in a display area 101 to a driver chip in a non-display area 102 (for example, the data line DATA may be connected to a lower area, generally referred to as a step area, of the array substrate). The first connection line 41 is disposed in a layer different from the layer where the data line DATA is disposed and the layer where the regulating signal line DVH is disposed. The first connection line 41 and the data line DATA are disposed in different layers. The first connection lines 41 and the regulating signal line DVH are disposed in different layers. The data line DATA and the regulating signal line DVH may be disposed in the same or different layers. The first connection line 41 and the second connection line 42 are located in the display area 101 and do not need to occupy the space of the non-display area 102, thereby reducing the bezel, and improving the screen-to-body ratio.

Exemplarily, referring to FIG. 9, the display area 101 includes non-right angle corners 51. The non-display area 102 includes chamfer areas 510. A chamfer area 510 is adjacent to a respective non-right angle corner 51. The chamfer area 510 abuts the respective non-right angle corner 51. The chamfer area 510 is located at the periphery of the respective non-right angle corner 51. The space of the chamfered area 510 is relatively small. If the connection lines 40 are disposed in the chamfered areas 510, the connection lines 40 occupy the space of the chamfered areas 510, and if other elements need to be arranged, only a relatively large bezel may be set. However, in embodiments of the present disclosure, the connection lines 40 are laid to the display area 101 so that the bezel can be reduced.

In an exemplary embodiment, referring to FIGS. 11 to 14, the second connection line 42 is disposed in a layer same as the layer where the data line DATA is disposed. Thus, the second connection line 42 and the data line DATA may be made of the same material and formed in the same process, thereby saving the process fabrication.

Exemplarily, referring to FIGS. 4, 11 to 14, the array substrate further includes a third metal layer M3 located on a side, of the second metal layer M2, which faces away from the substrate 10. The second connection line 42 and the data lines DATA disposed in the same layer are arranged in the first direction X. The second connection line 42 and the data line DATA are spaced apart by a certain distance to prevent an undesirable electrical connection between the second connection line 42 and the data line DATA. The second connection line 42 and the data line DATA are both located in the third metal layer M3. In other embodiments, the second connection line 42 and the data line DATA may also be located in another metal layer.

In an exemplary embodiment, referring to FIGS. 11 to 14, the film where the first connection line 41 is disposed is located between the film where the data line DATA is disposed and the substrate 10.

Exemplarily, referring to FIGS. 13 and 14, the first connection line 41 is located in the capacitor metal layer MC. The data line DATA is located in the third metal layer M3. The film where the first connection line 41 is disposed is located between the film where the data line DATA is disposed and the substrate 10. The first connection line 41 is electrically connected to the respective data line DATA through a via 61. The power signal line PVDD include a second power signal line PVDD2 extending in the second direction Y and located in the third metal layer M3.

Figure 15:
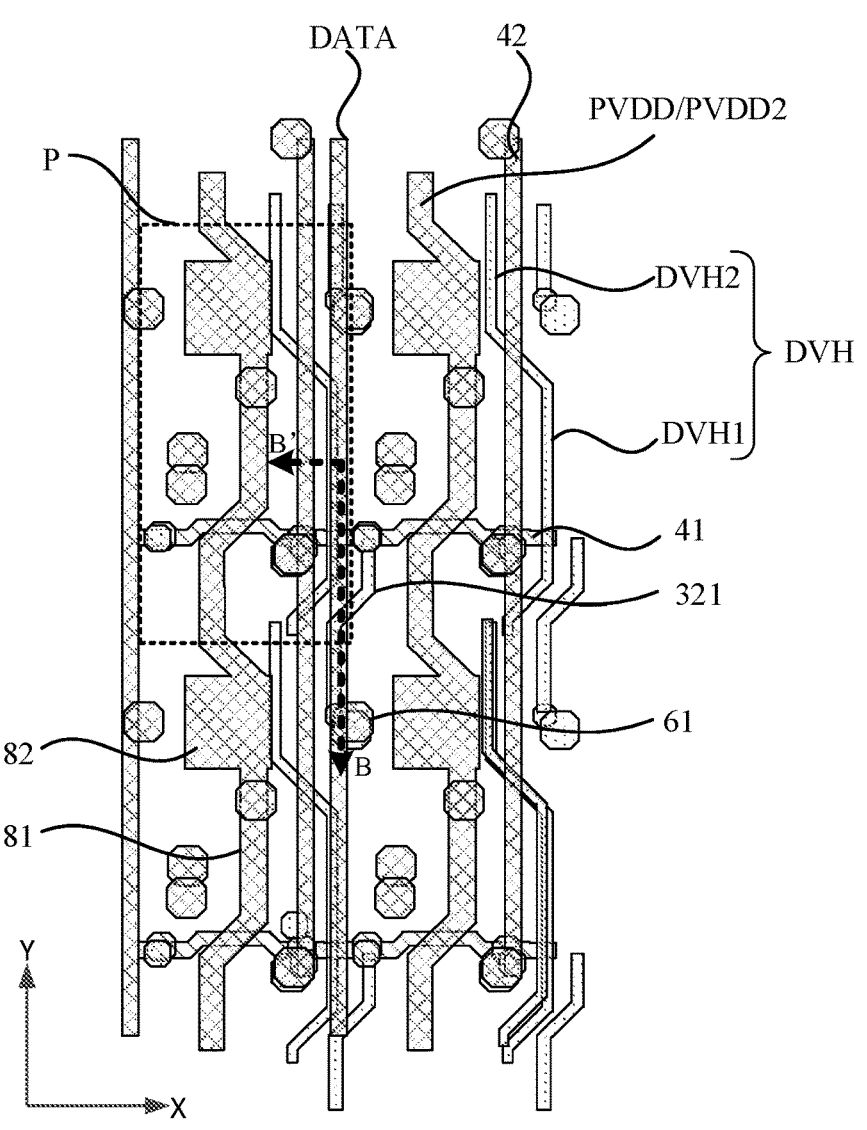
FIG. 15 is a view of another portion of the structure of the pixel driving circuit of FIG. 11.
Figure 16:
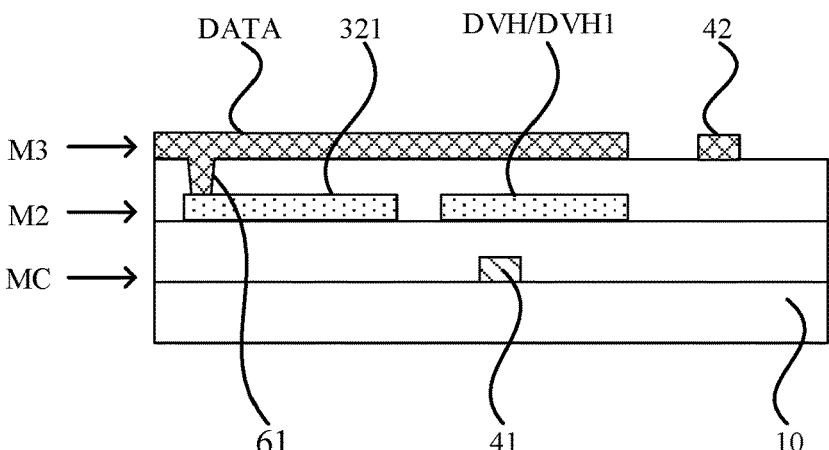
FIG. 16 is a sectional view taken along BB' of FIG. 15.

FIG. 15 is a view of another portion of the structure of the pixel driving circuit of FIG. 11. FIG. 16 is a sectional view taken along BB' of FIG. 15. Referring to FIGS. 15 and 16, the film where the first connection line 41 is disposed is located between the film where the regulating signal line DVH is disposed and the substrate 10.

Exemplarily, referring to FIGS. 15 and 16, the first connection line 41 is located in the capacitor metal layer MC. The regulating signal line DVH is located in the second metal layer M2. The film where the first connection line 41 is disposed is located between the film where the regulating signal line DVH is disposed and the substrate 10.

Exemplarily, referring to FIGS. 15 and 16, the film where the regulating signal line DVH is disposed is located between the film where the data line DATA is disposed and the substrate 10. In another embodiment, the regulating signal line DVH is disposed in the layer same as the layer where the data line DATA is disposed. In another embodiment, the film where the regulating signal line DVH is disposed on a side of the film where the data line DATA is disposed, which faces away from the substrate 10.

Exemplarily, referring to FIGS. 9, 13, and 14, the data lines DATA extending in the second direction Y are connected to the first connection lines 41 extending in the first direction X through vias 61. The first connection line 41 extending in the first direction X are connected to the second connection lines 42 extending in the second direction Y through the vias 61. Thus, the data lines DATA are connected to the driver chips in the non-display area 102. It is to be understood that the data line DATA is electrically connected to the first connection line 41 only through a via 61 at the overlapping position of the data line DATA and the first connection line 41. The data line DATA is not electrically connected to the first connection line 41 if no via 61 is set at the overlapping position of the data line DATA and the first connection line 41. It is to be noted that in embodiments of the present disclosure, the vias 61 may be holes provided on an organic layer or an inorganic layer. When the metal layer above the holes is formed, metal materials are formed in the holes as connection portions. Therefore, the vias 61 may be considered as the connection portions of the holes and in the holes.

Figure 17:
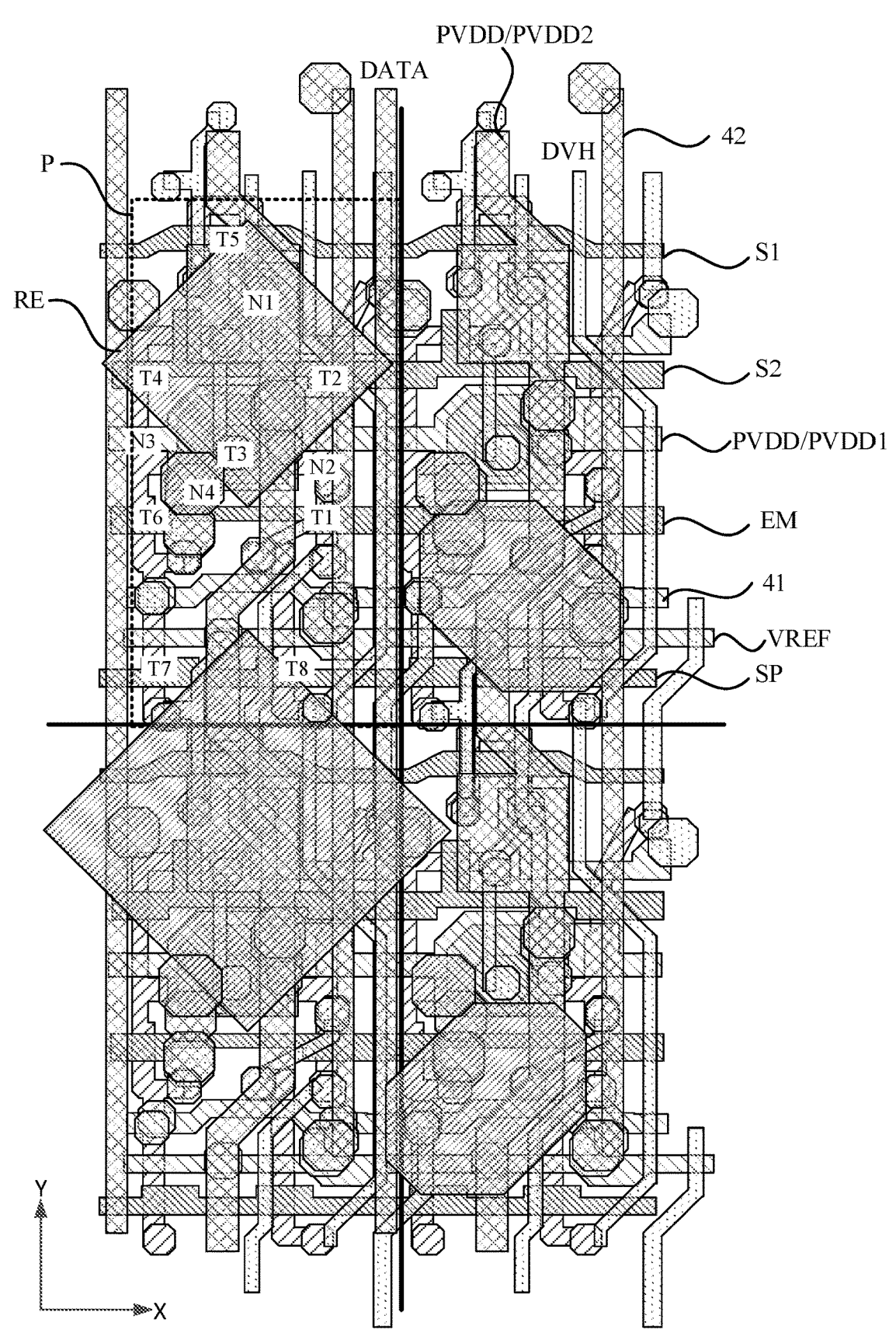
FIG. 17 is a top view of another pixel driving circuit according to an embodiment of the present disclosure.

FIG. 17 is a top view of another pixel driving circuit according to an embodiment of the present disclosure. Referring to FIGS. 1, 2, 4, and 17, the pixel driving circuits 20 are configured to drive light-emitting elements LD to emit light and display, and control the brightness of the light-emitting elements LD. In the direction perpendicular to the substrate 10, a light-emitting element LD is located on a side of a film where the pixel driving circuit is disposed, which faces away from the substrate 10. The light-emitting element LD includes an anode RE. The anode RE of the light-emitting element LD is electrically connected to the source 203 or the drain 204 of the thin-film transistor 200.

In an exemplary embodiment, referring to FIGS. 11 to 14, the signal lines 30 further include a reset signal lines VREF extending in the first direction X. A film where the reset signal line VREF is disposed is located between the film where the scan signal line 31 is disposed and the film where the regulating signal line DVH is disposed. The first connection line 41 is disposed in the layer same as the layer where the reset signal line VREF is disposed so that the first connection line 41 and the reset signal line VREF may be made of the same material and formed in the same process, thereby saving the process fabrication.

Exemplarily, referring to FIGS. 11 to 16, the scan signal line 31 is located in the first metal layer M1. The first connection line 41 and the reset signal line VREF are both located in the capacitor metal layer MC. The regulating signal line DVH is located in the second metal layer M2.

Exemplarily, referring to FIGS. 11 to 16, the film where the first connection line 41 is disposed is located between the film where the data line DATA is disposed and the substrate 10. The layer where the first connection line 41 is disposed is located between the layer where the regulating signal line DVH is disposed and the substrate 10. The second connection line 42 and the data line DATA are both located in the third metal layer M3. Thus, in embodiments of the present disclosure, there is no need to additionally set the first connection line 41, the second connection line 42, and the regulating signal line DVH. That is, there is no need to set a fourth metal layer or more to form the first connection line 41, the second connection line 42, and the regulating signal line DVH, thereby reducing the number of metal layers, reducing the thickness of the array substrate, and reducing the process fabrication.

In an exemplary embodiment, referring to FIG. 11, the first connection line 41 is disposed in the layer same as the layer where the reset signal line VREF is disposed. An area where the pixel driving circuits 20 are located is a pixel area P. In the same pixel area P, the first connection line 41 is located between the reset signal line VREF and the light-emitting control scan signal line EM.

Exemplarily, referring to FIG. 11, FIG. 11 shows four pixel areas P. The four pixel areas P form a matrix of two rows and two columns in the first direction X and the second direction Y. To clearly distinguish different pixel areas P, in FIG. 11, one lateral solid line is used to represent the boundary of adjacent pixel areas P in the first direction X, and one vertical solid line is used to represent the boundary of adjacent pixel areas P in the second direction Y.

Exemplarily, referring to FIG. 11, the signal line 30 extending in the first direction X may be electrically connected to multiple pixel driving circuits 20 arranged in the first direction X. The signal line 30 extending in the second direction Y may be electrically connected to multiple pixel driving circuits 20 arranged in the second direction Y.

In an exemplary embodiment, referring to FIGS. 11 to 14, the array substrate further includes a first jumper 321. The first jumper 321 is disposed in a layer different from both the layer where the data line DATA is disposed and the layer where the first connection line 41 is disposed. The first jumper 321 and the data line DATA are disposed in different layers. The first jumper 321 and the first connection line 41 are disposed in different layers. A first terminal of the first jumper 321 is electrically connected to the data line DATA through the via 61. A second terminal of the first jumper 321 is electrically connected to the first connection line 41 through the via 61. The first jumper 321 is configured to connect the data line DATA to the first connection line 41. The data line DATA and the second connection line 42 are disposed in the same layer. The distance between the data line DATA and the second connection line 42 is relatively close. The via 61 is set at the overlapping position of the second connection line 42 and the first connection line 41. If the via 61 is set at the overlapping position of the data line DATA and the first connection line 41, the via 61 on the data line DATA and the via 61 on the second connection line 42 may overlap due to insufficient space, thereby generating an undesirable electrical connection. In other words, the data line DATA is adjacent to the second connection line 42, and there is not enough space provided for two adjacent vias 61 directed penetrating through and connected to the first connection line 41. In embodiments of the present disclosure, the first jumper 321 is used as an intermediary connecting the data line DATA and the first connection line 41, and the position of the via 61 connecting the first jumper 321 and the first connection line 41 is relatively free, thereby avoiding the problem of insufficient space for adjacent vias 61.

In an exemplary embodiment, referring to FIGS. 11 to 16, the first jumper 321 and the regulating signal line DVH are disposed in the same layer. Thus, the first jumper 321 and the regulating signal line DVH may be made of the same material and formed in the same process, thereby saving the process fabrication.

Exemplarily, referring to FIG. 16, the first jumper 321 and the regulating signal line DVH are both located in the second metal layer M2.

Figure 18:
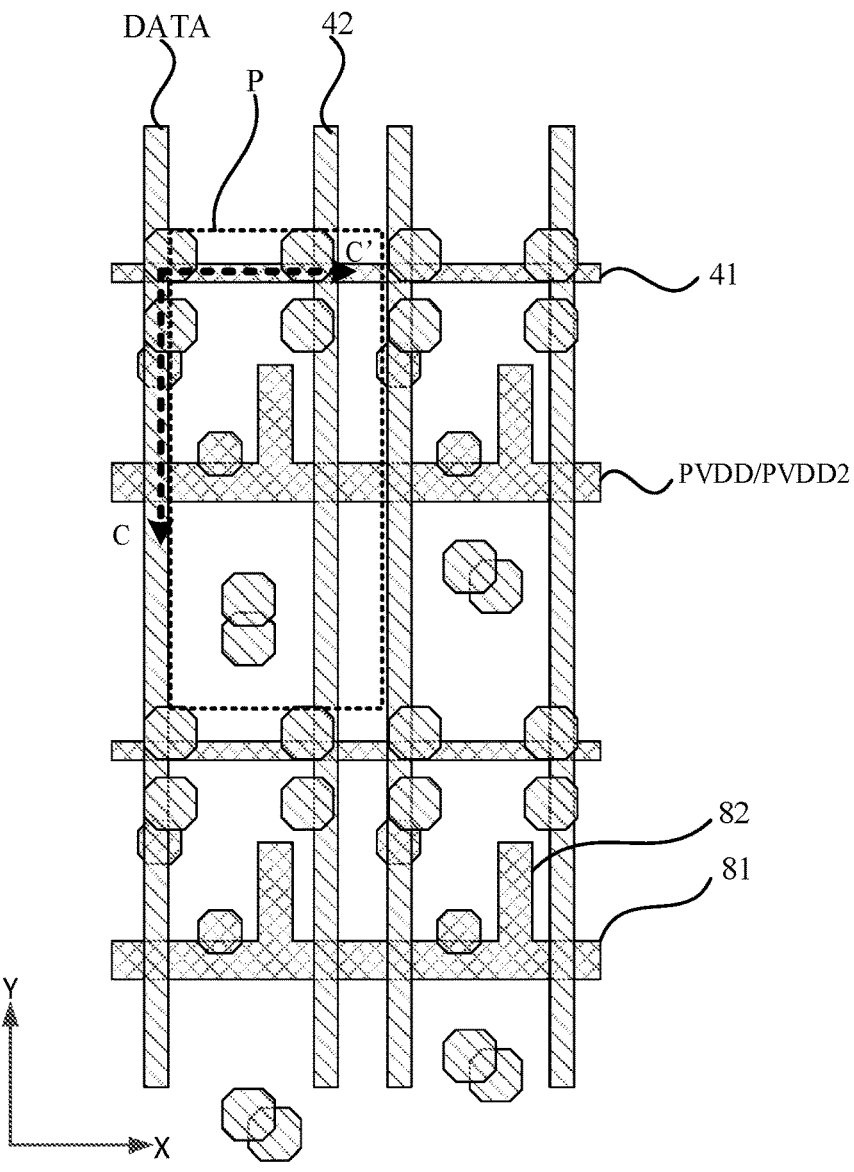
FIG. 18 is a top view of another pixel driving circuit according to an embodiment of the present disclosure.
Figure 19:
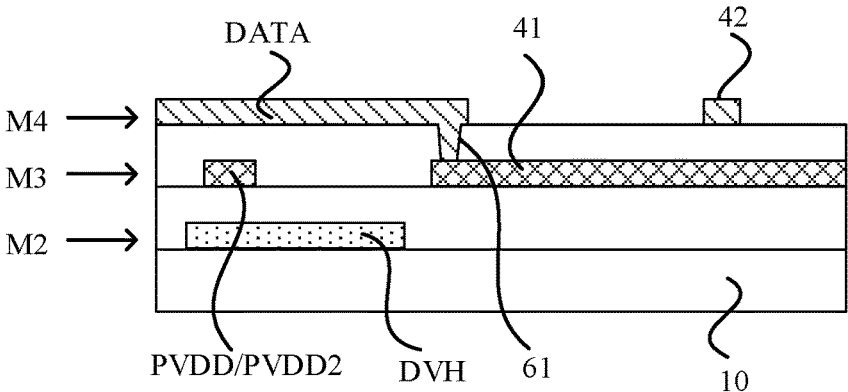
FIG. 19 is a sectional view taken along CC' of FIG. 18.

FIG. 18 is a top view of another pixel driving circuit according to an embodiment of the present disclosure. FIG. 19 is a sectional view taken along CC' of FIG. 18. Referring to FIGS. 18 and 19, the film where the first connection line 41 is disposed is located on a side of the film where the regulating signal line DVH is disposed, which faces away from the substrate 10.

Exemplarily, referring to FIGS. 18 and 19, the first connection line 41 is located in the third metal layer M3, and the regulating signal line DVH is located in the second metal layer M2. The film where the regulating signal line DVH is disposed is located between the film where the first connection line 41 is disposed and the substrate 10.

In an exemplary embodiment, referring to FIGS. 18 and 19, the film where the first connection line 41 is disposed is located between the film where the regulating signal line DVH is disposed and the film where the regulating data line DATA is disposed.

Exemplarily, referring to FIGS. 18 and 19, the array substrate further includes a fourth metal layer M4 located on a side of the third metal layer M3, which faces away from the substrate 10. The data line DATA and the second connection line 42 are both located in the fourth metal film M4. The first connection line 41 is located in the third metal layer M3, and the regulating signal line DVH is located in the second metal layer M2. The power signal line PVDD includes a second power signal line PVDD2 extending in the first direction X. A second power signal line PVDD2 is located in the third metal layer M3.

Figure 20:
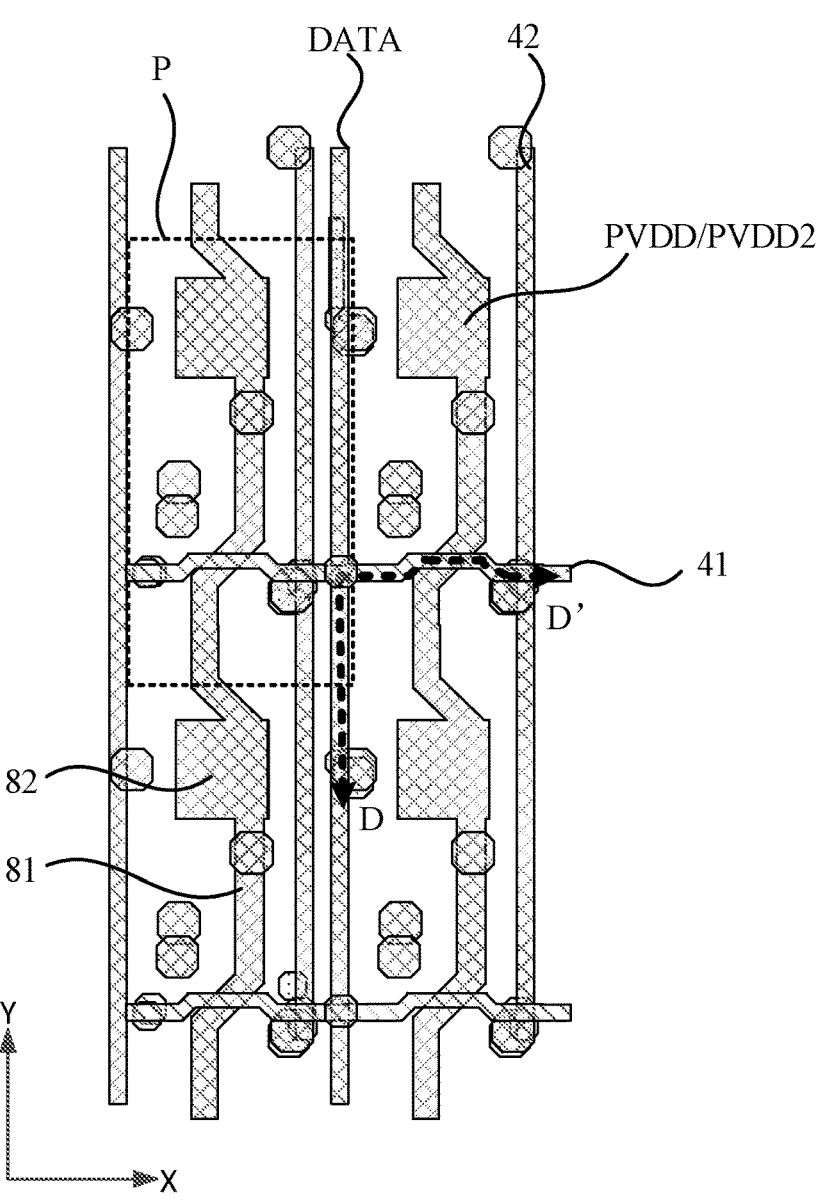
FIG. 20 is a top view of another pixel driving circuit according to an embodiment of the present disclosure.
Figure 21:
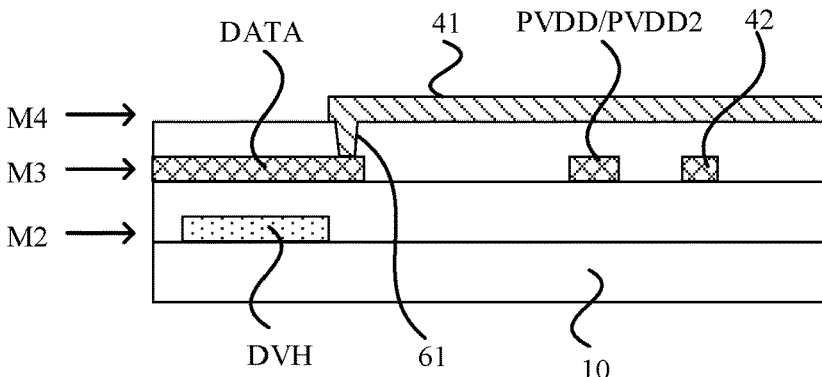
FIG. 21 is a sectional view taken along DD' of FIG. 20.

FIG. 20 is a top view of another pixel driving circuit according to an embodiment of the present disclosure. FIG. 21 is a sectional view taken along DD' of FIG. 20. Referring to FIGS. 20 and 21, the film where the first connection line 41 is disposed is located on a side of the film where the data line DATA is disposed, which faces away from the substrate 10.

Exemplarily, referring to FIGS. 20 and 21, the data line DATA and the second connection line 42 are both located in the third metal layer M3. The first connection line 41 is located in the fourth metal layer M4, and the regulating signal line DVH is located in the second metal layer M2. The power signal line PVDD includes the second power signal line PVDD2 extending in the second direction Y. The second power signal line PVDD2 is located in the third metal layer M3.

Figure 22:
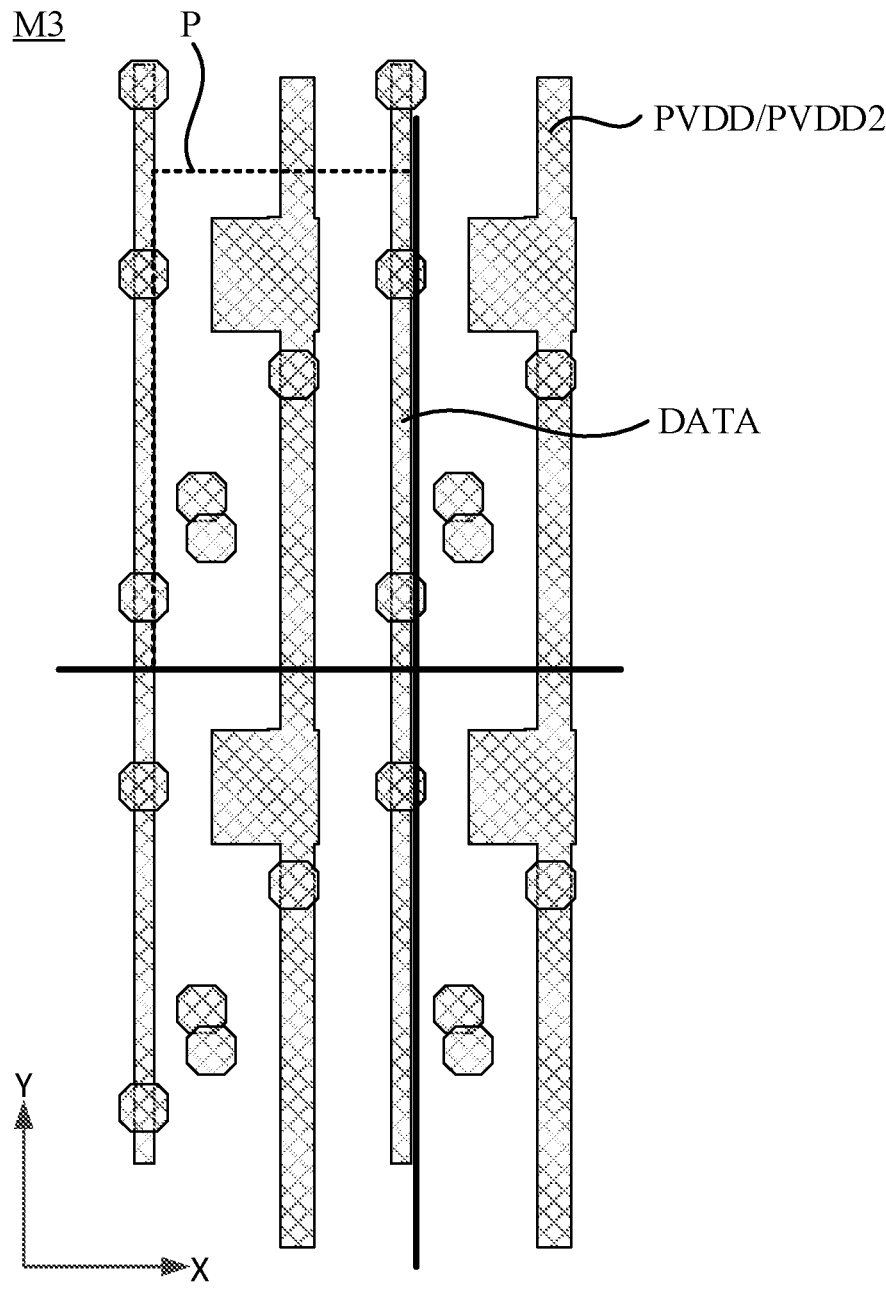
FIG. 22 is a top view of another third metal layer according to an embodiment of the present disclosure.
Figure 23:
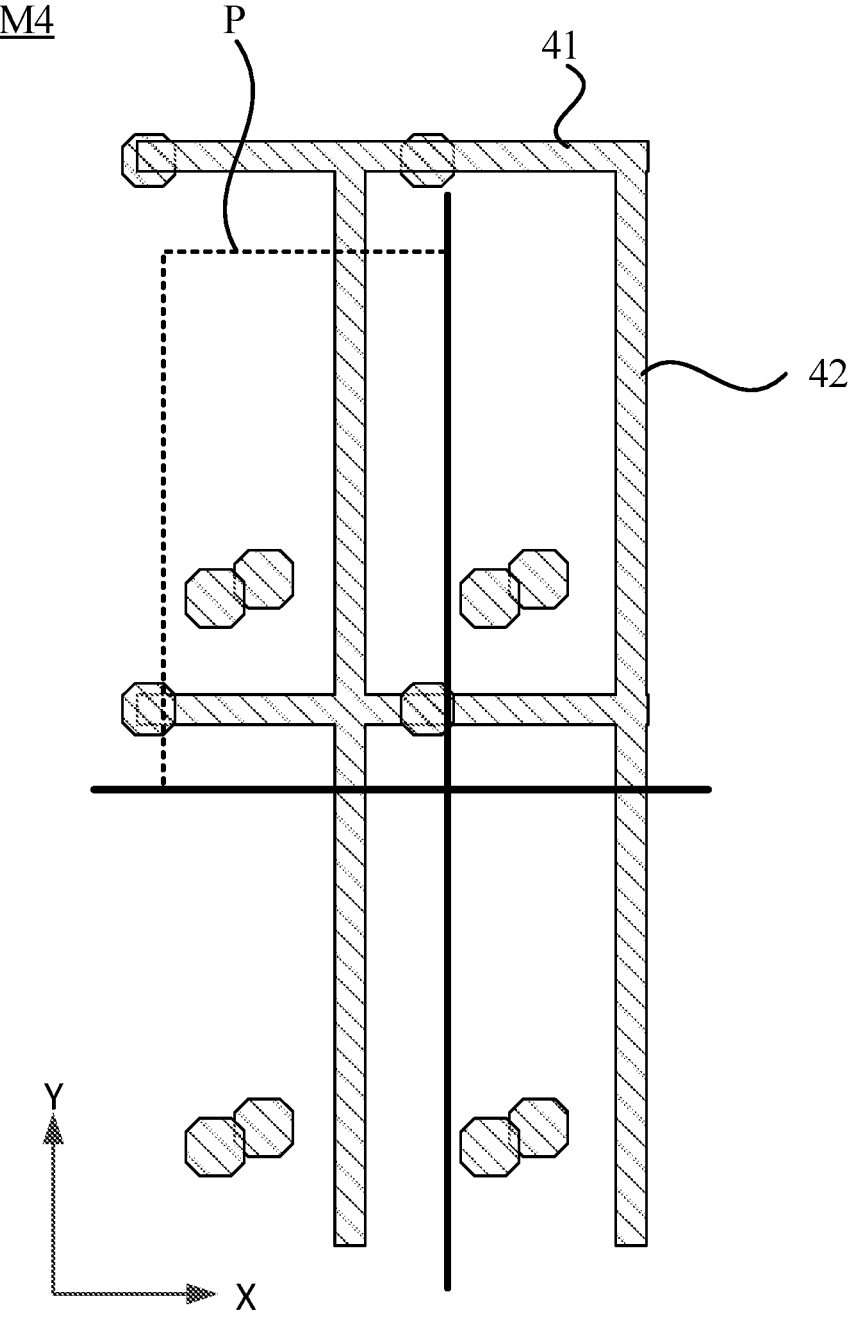
FIG. 23 is a top view of a fourth metal layer according to an embodiment of the present disclosure.
Figure 24:
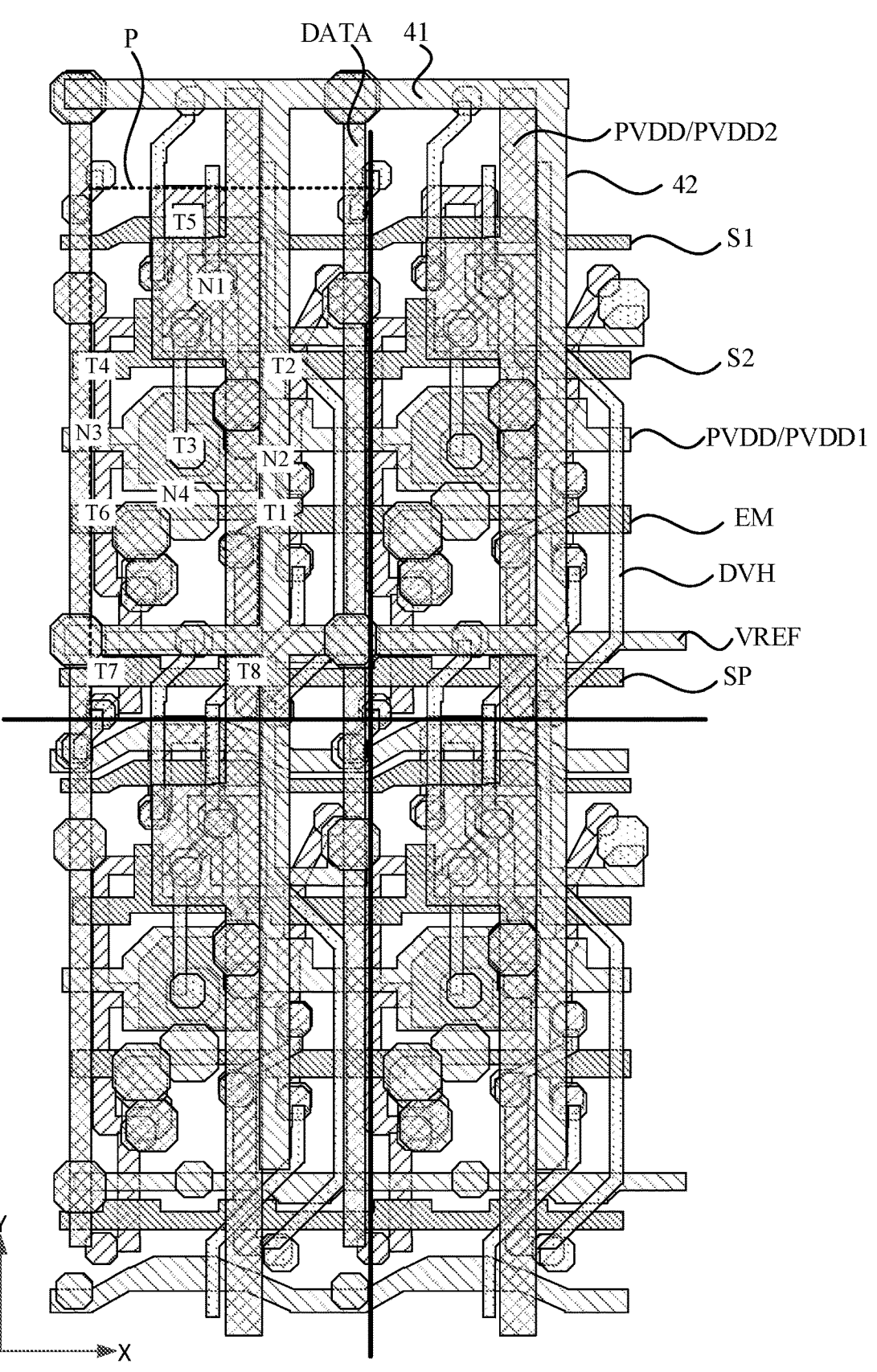
FIG. 24 is a top view of another pixel driving circuit according to an embodiment of the present disclosure.
Figure 25:
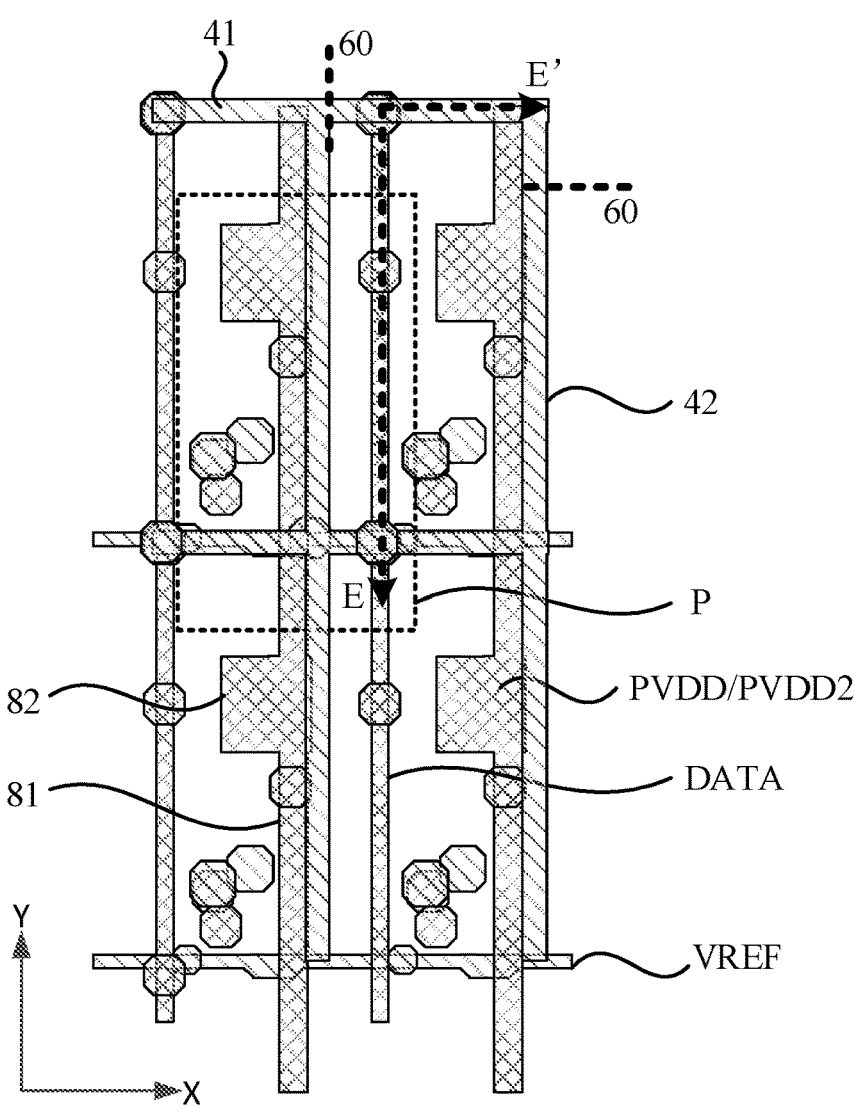
FIG. 25 is a view of a portion of the structure of the pixel driving circuit of FIG. 24.
Figure 26:
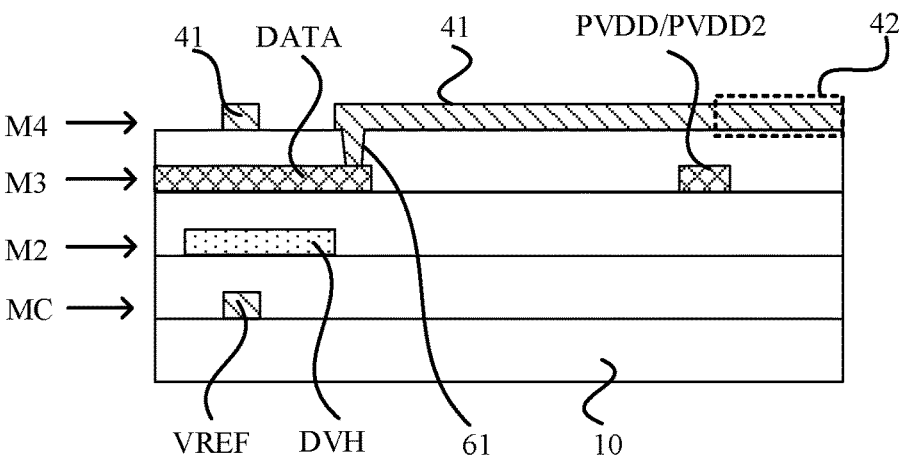
FIG. 26 is a sectional view taken along EE' of FIG. 25.

FIG. 22 is a top view of another third metal layer according to an embodiment of the present disclosure. FIG. 23 is a top view of a fourth metal layer according to an embodiment of the present disclosure. FIG. 24 is a top view of another pixel driving circuit formed by stacking the third metal layer shown in FIG. 22 and the fourth metal layer shown in FIG. 23 on the basis of FIG. 3. FIG. 24 is a top view of another pixel driving circuit according to an embodiment of the present disclosure. FIG. 25 is a view of a portion of the structure of the pixel driving circuit of FIG. 24. FIG. 26 is a sectional view taken along EE' of FIG. 25. Referring to FIGS. 22 to 26, the second connection line 42 and the data line DATA are disposed in different layers. The layer where the second connection line 42 is disposed may be located between the film where the data line DATA is disposed and the substrate 10. Alternatively, the film where the second connection line 42 is disposed may be located on a side of the film where the data line DATA is disposed, which faces away from the substrate 10.

In an example, referring to FIGS. 24 to 26, the film where the second connection line 42 is disposed is located on a side of the film where the data line DATA is disposed, which faces away from the substrate 10.

Exemplarily, referring to FIGS. 25 and 26, the second connection line 42 is located in the fourth metal layer M4. The data line DATA is located in the third metal layer M3. The regulating signal line DVH is located in the second metal layer M2. The reset signal line VREF is located in the capacitor metal layer MC. The power signal line PVDD includes the second power signal line PVDD2 extending in the second direction Y. The second power signal line PVDD2 is located in the third metal layer M3.

In an exemplary embodiment, referring to FIGS. 24 to 26, the first connection line 41 and the second connection line 42 are disposed in the same layer. For example, the first connection line 41 and the second connection line 42 are both located in the fourth metal layer M4. It is to be noted that to prevent the undesirable electrical connection, at least one of the first connection line 41 or the second connection line 42 may be cut at a cutting position 60.

In an exemplary embodiment, referring to FIGS. 14, 19, and 26, the film where the regulating signal line DVH is disposed is located between the film where the second connection line 42 is disposed and the substrate 10. The film where the regulating signal line DVH is disposed is located between the film where the data line DATA is disposed and the substrate 10. The regulating signal line DVH may be formed using an original metal layer in the array substrate so that there is no need to add a new metal layer, reducing the thickness of the array substrate, and reducing the process fabrication.

Figure 27:
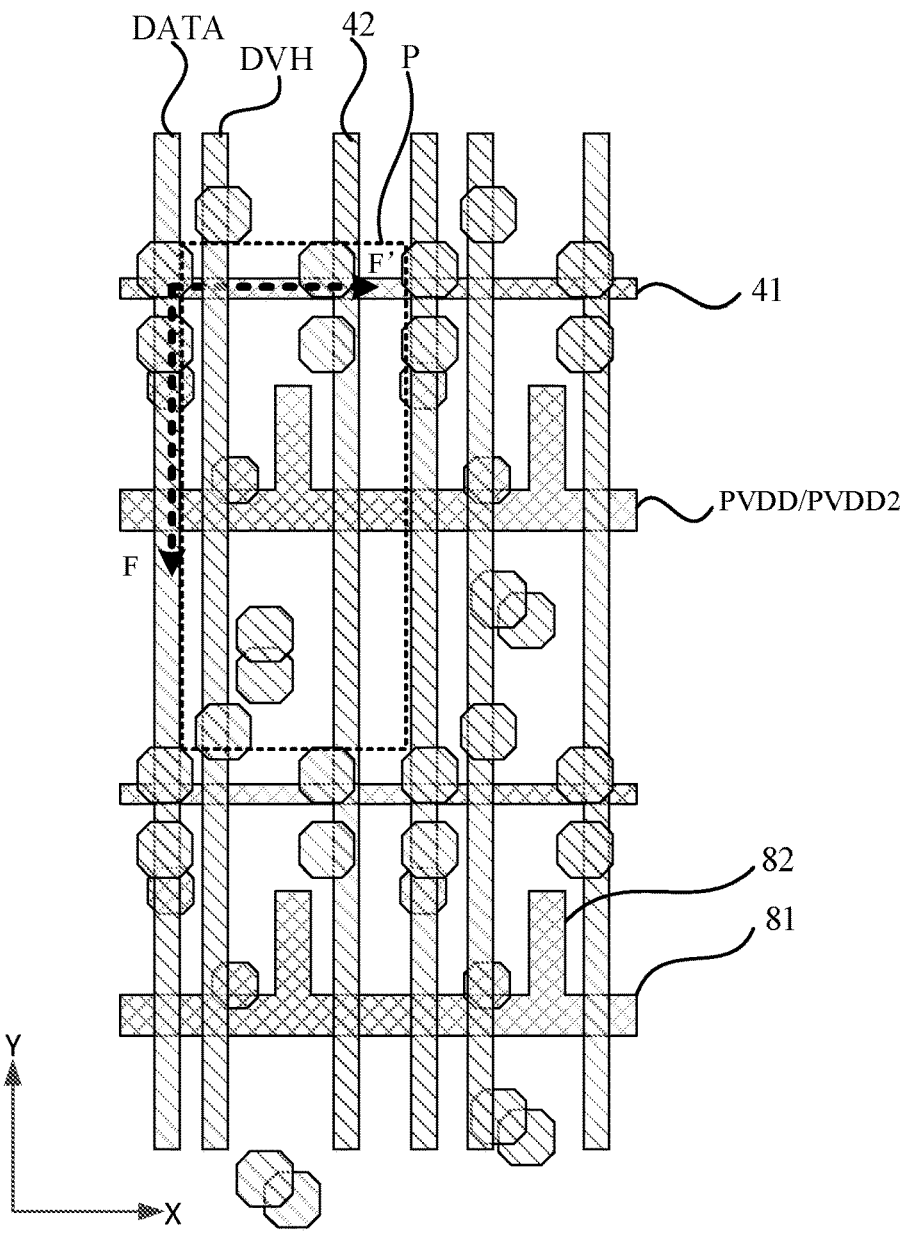
FIG. 27 is a top view of another pixel driving circuit according to an embodiment of the present disclosure.
Figure 28:
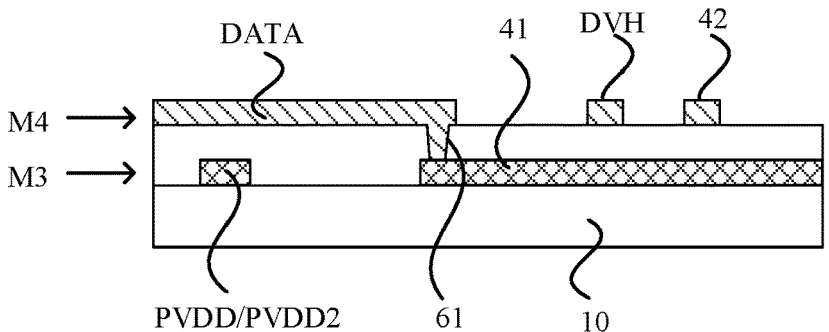
FIG. 28 is a sectional view taken along FF' of FIG. 27.

FIG. 27 is a top view of another pixel driving circuit according to an embodiment of the present disclosure. FIG. 28 is a sectional view taken along FF' of FIG. 27. Referring to FIGS. 27 and 28, the regulating signal line DVH, the second connection line 42, and the data line DATA are disposed in the same layer. Thus, the regulating signal line DVH, the second connection line 42, and the data line DATA can be made of the same material and formed in the same process, thereby saving the process fabrication.

In an exemplary embodiment, referring to FIGS. 27 and 28, the first connection line 41 is located in the third metal layer M3. The regulating signal line DVH, the second connection lines 42, and the data line DATA are all located in the fourth metal layer M4. The power signal line PVDD includes the second power signal line PVDD2 extending in the first direction X. The second power signal line PVDD2 is located in the third metal layer M3.

Figure 29:
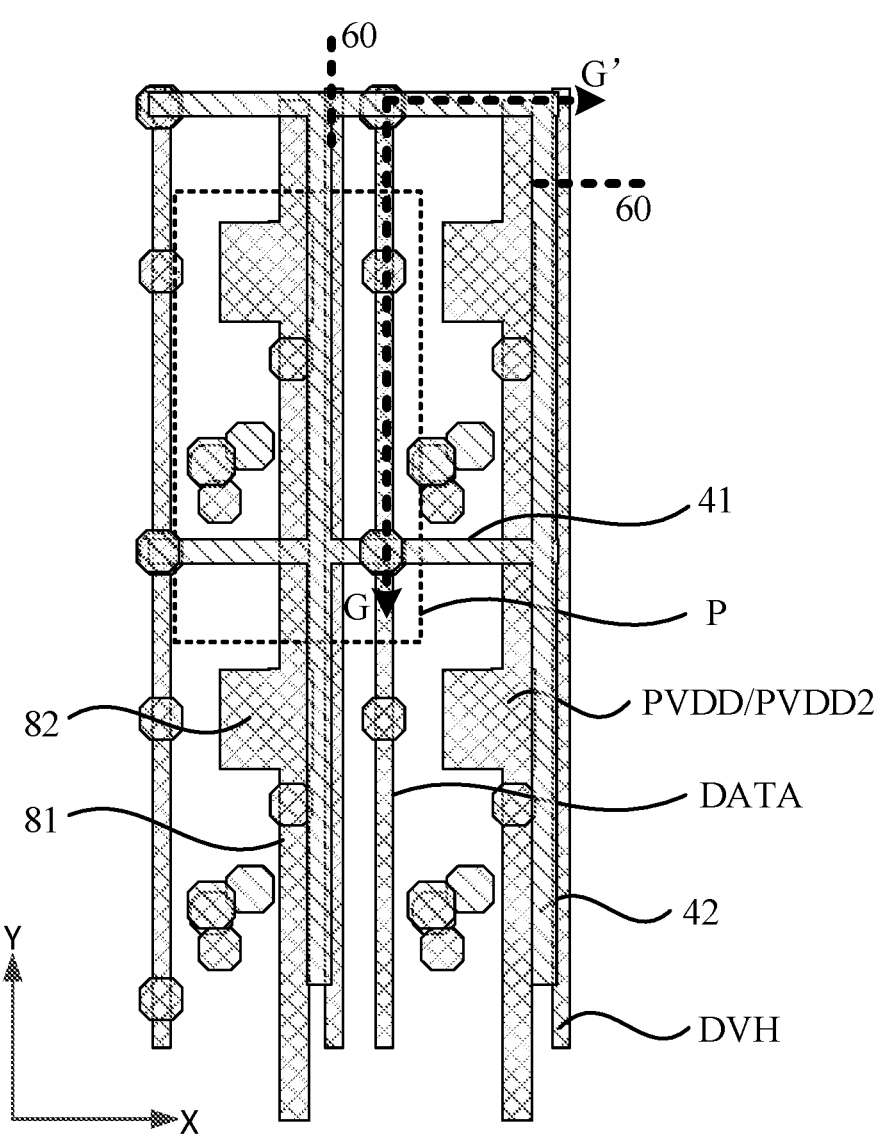
FIG. 29 is a top view of another pixel driving circuit according to an embodiment of the present disclosure.
Figure 30:
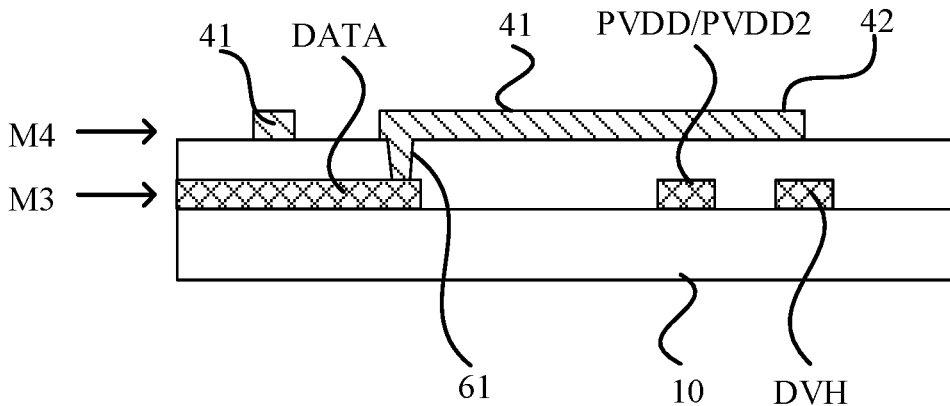
FIG. 30 is a sectional view taken along GG' of FIG. 29.

FIG. 29 is a top view of another pixel driving circuit according to an embodiment of the present disclosure. FIG. 30 is a sectional view taken along GG' of FIG. 29. Referring to FIGS. 29 and 30, the regulating signal line DVH and the data line DATA are disposed in the same layer. The film where the regulating signal line DVH is disposed is located between the film where the second connection line 42 is disposed and the substrate 10.

Exemplarily, referring to FIGS. 29 and 30, the regulating signal line DVH and the data line DATA are both located in the third metal layer M3. The first connection line 41 and the second connection line 42 are both located in the fourth metal layer M4. The power signal line PVDD includes the second power signal line PVDD2 extending in the second direction Y. The second power signal line PVDD2 is located in the third metal layer M3.

Figure 31:
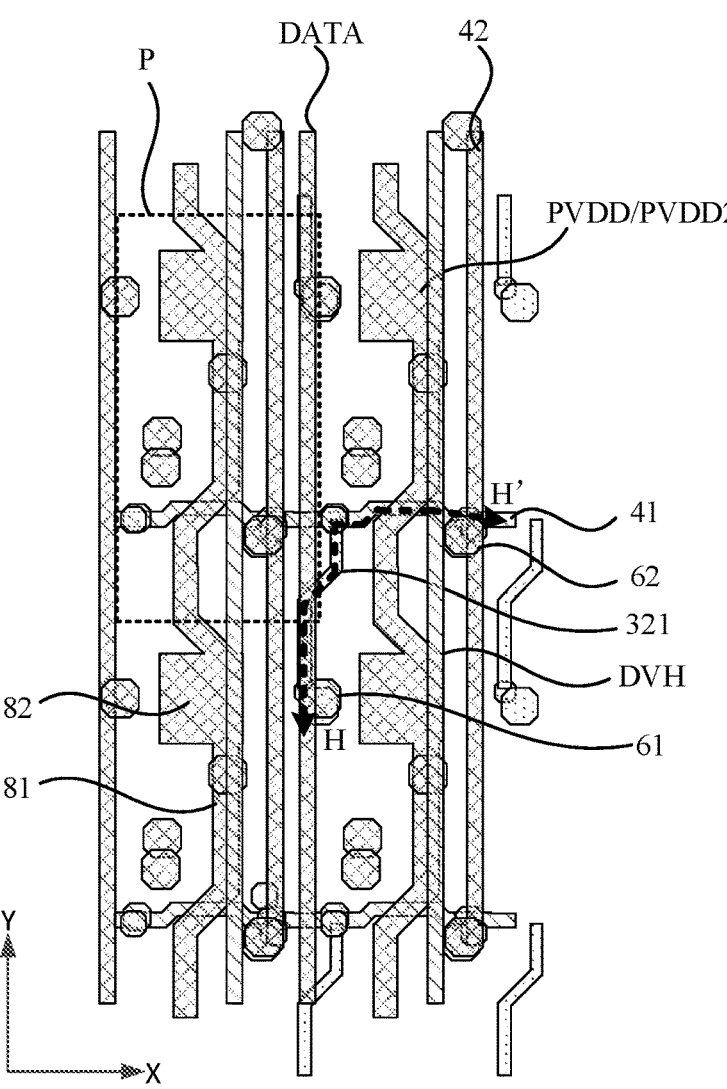
FIG. 31 is a top view of another pixel driving circuit according to an embodiment of the present disclosure.
Figure 32:
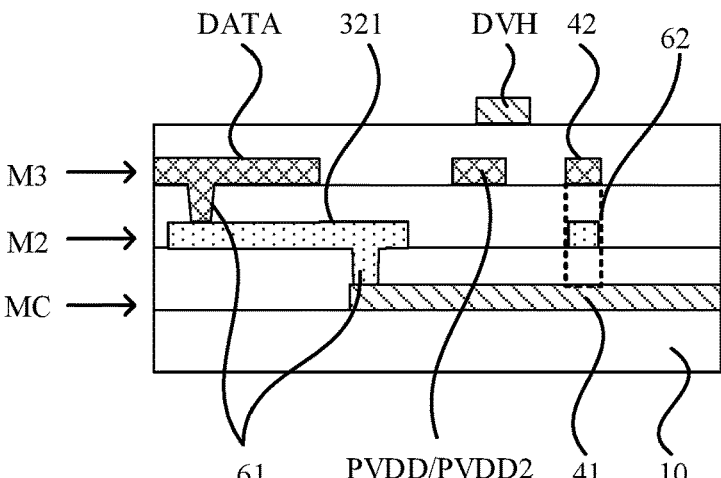
FIG. 32 is a sectional view taken along HH' of FIG. 31.

FIG. 31 is a top view of another pixel driving circuit according to an embodiment of the present disclosure. FIG. 32 is a sectional view taken along HH' of FIG. 31. Referring to FIGS. 31 and 32, the regulating signal line DVH is located on a side of the data line DATA, which faces away from the substrate 10. The second connection line 42 and the data line DATA are disposed in the same layer.

Exemplarily, referring to FIGS. 31 and 32, the first connection line 41 is located in the capacitor metal layer MC. The second connection lines 42 and the data line DATA are both located in the third metal layer M3. The regulating signal line DVH is located in the fourth metal layer M4. The power signal line PVDD includes the second power signal line PVDD2 extending in the second direction Y. The second power signal line PVDD2 is located in the third metal layer M3.

In an exemplary embodiment, referring to FIGS. 19 and 26, the signal lines 30 further include a reset signal line VREF. The reset signal line VREF extends in the first direction X. The film where the reset signal line VREF is disposed is located between the film where the scan signal line 31 is disposed and the film where the regulating signal line DVH is disposed. The reset signal line VREF and the first connection line 41 are disposed in different layers. In a direction perpendicular to the plane where the substrate 10 is located, the first connection line 41 and the reset signal line VREF at least partially overlap, reducing the common light-shading area of the first connection line 41 and the reset signal line VREF, and increasing the transmittance.

Exemplarily, referring to FIGS. 19 and 26, the reset signal line VREF is located in the capacitor metal layer MC, and the first connection line 41 is located in the third metal layer M3 or the fourth metal layer M4. In the direction perpendicular to the substrate 10, the distance between the first connection line 41 and the reset signal line VREF is relatively far so that the signal on the reset signal line VREF is not affected. On the other hand, the reset signal line VREF and the scan signal line 31 do not overlap so that the signal on the scan signal line 31 is not affected, and the control process of turning on or off the thin-film transistor 200 by the scan signal line 31 is not affected.

Figure 33:
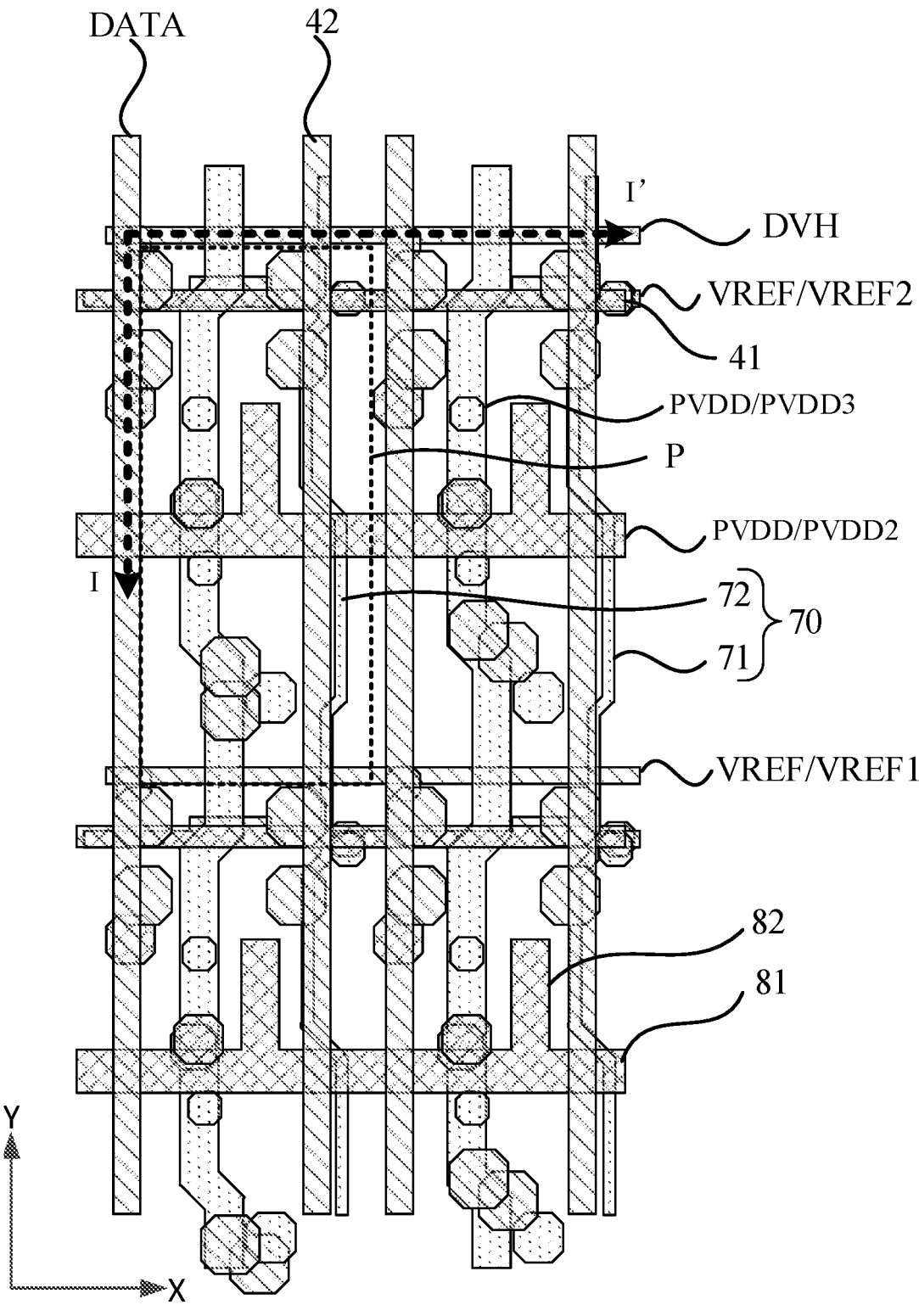
FIG. 33 is a top view of another pixel driving circuit according to an embodiment of the present disclosure.
Figure 34:
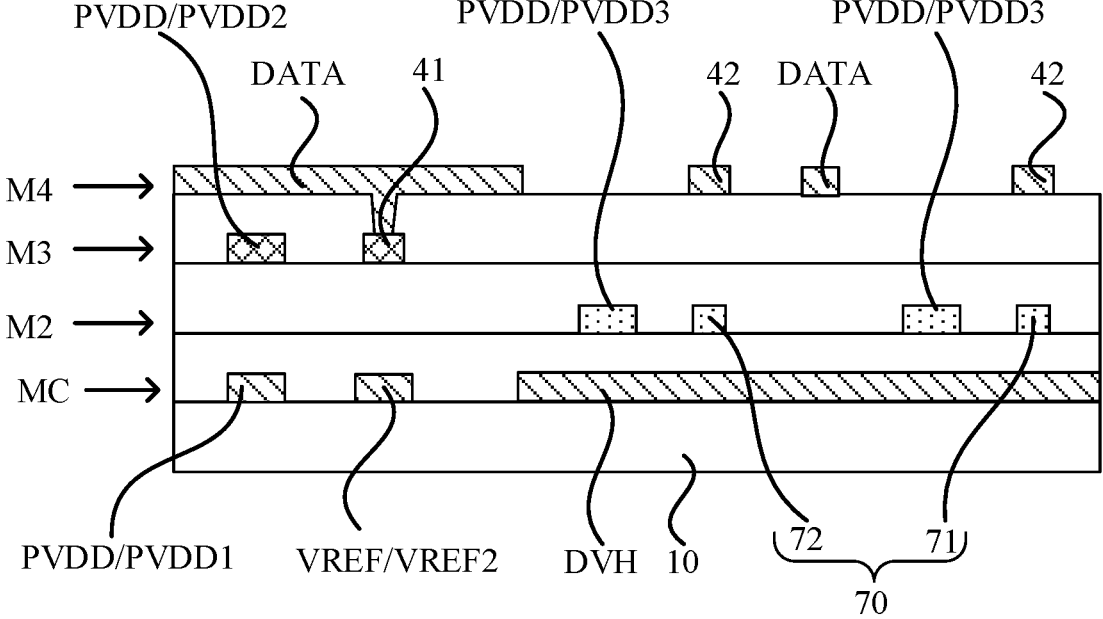
FIG. 34 is a sectional view taken along II' of FIG. 33.

FIG. 33 is a top view of another pixel driving circuit according to an embodiment of the present disclosure. FIG. 34 is a sectional view taken along II' of FIG. 33. Referring to FIGS. 33 and 34, the signal lines 30 further include an auxiliary reset signal line 70. The auxiliary reset signal line 70 extends in the second direction Y. The auxiliary reset signal line 70 and the regulating signal line DVH are disposed in the same layer. Thus, the auxiliary reset signal line 70 and the regulating signal line DVH can be made of the same material and formed in the same process, thereby saving the process fabrication. The second connection line 42 and the auxiliary reset signal line 70 are disposed in different layers. In a direction perpendicular to the plane where the substrate 10 is located, the second connection line 42 and the auxiliary reset signal line 70 overlap, reducing the common light-shading area of the second connection line 42 and the auxiliary reset signal line 70, and increasing the transmittance.

Exemplarily, referring to FIGS. 33 and 34, the auxiliary reset signal line 70 includes a first auxiliary reset signal line 71 and a second auxiliary reset signal line 72. The first auxiliary reset signal line 71 is electrically connected to the first reset signal line VREF1 through the via 61. The second auxiliary reset signal line 72 is electrically connected to the second reset signal line VREF2 through the via 61. In the direction perpendicular to the plane where the substrate 10 is located, the second connection line 42 and the first auxiliary reset signal line 71 overlap. The second connection line 42 and the second auxiliary reset signal line 72 overlap. In the direction perpendicular to the plane where the substrate 10 is located, the first connection line 41 and the second reset signal line VREF2 overlap.

In an exemplary embodiment, referring to FIGS. 15 and 16, the regulating signal line DVH and the data line DATA are disposed in different layers. The regulating signal line DVH includes a first line segment DVH1. The first line segment DVH1 extends in the second direction Y. In the direction perpendicular to the plane where the substrate 10 is located, the first line segment DVH1 and the data line DATA overlap, reducing the common light-shading area of the regulating signal line DVH and the data line DATA, and increasing the transmittance.

Exemplarily, referring to FIGS. 15 and 16, the regulating signal line DVH includes the first line segment DVH1 and the second line segment DVH2. The first line segment DVH1 extends in the second direction Y. The second line segment DVH2 extends in the second direction Y. The first line segment DVH1 and the second line segment DVH2 are non-collinear. The regulating signal line DVH includes multiple polyline segments. In other embodiments, the regulating signal line DVH may also be a whole straight line segment. Compared with the polyline segment or a curved line segment, the straight line segment is simple in structure and does not easily cause problems such as over-etching and the like, thereby reducing the process difficulty.

In an exemplary embodiment, referring to FIGS. 12, 18 and 25, in the first direction X, one second connection line 42 is disposed between two adjacent data lines DATA. One data line DATA is disposed between two adjacent second connection lines 42. In the first direction X, the data line DATA and the second connection line 42 are alternately arranged. It is to be noted that other signal lines 30 may or may not be disposed between the data line DATA and the second connection line 42.

Exemplarily, referring to FIG. 12, the power signal line PVDD extending in the second direction Y is included between the data line DATA and the second connection line 42 in the first direction X. Referring to FIG. 18, the power signal line PVDD extending in the second direction Y is not disposed between the data line DATA and the second connection line 42 in the first direction X.

In an exemplary embodiment, referring to FIGS. 33 and 34, the power signal line PVDD includes a first power signal line PVDD1 and a second power signal line PVDD2 electrically connected to the first power signal line PVDD1. The first power signal line PVDD1 extends in the first direction X. The second power signal line PVDD2 extends in the first direction X. In a direction perpendicular to the plane where the substrate 10 is located, the first power signal line PVDD1 is disposed in a layer different from a layer where the second power signal line PVDD2 is disposed, and the first power signal line PVDD1 and the second power signal line PVDD2 overlap, reducing the common light-shading area of the first power signal line PVDD1 and the second power signal line PVDD2, and increasing the transmittance.

Exemplarily, referring to FIGS. 33 and 34, the first power signal line PVDD1 and the reset signal line VREF are in the same layer. The first power signal line PVDD1 is located in the capacitor metal layer MC. The second power signal line PVDD2 and the first connection line 41 are in the same layer.

The second power signal line PVDD2 is located in the third metal layer M3. The power signal line PVDD may also include a third power signal line PVDD3. The third power signal line PVDD3 is electrically connected to the first power signal line PVDD1 and the second power signal line PVDD2. The third power signal line PVDD3 and the auxiliary reset signal line 70 are in the same layer. The third power signal line PVDD3 is located in the second metal layer M2.

In an exemplary embodiment, referring to FIGS. 11 to 16, the power signal line PVDD includes a first power signal line PVDD1 and a second power signal line PVDD2 electrically connected to the first power signal line PVDD1. The first power signal line PVDD1 extends in the first direction X. The second power signal line PVDD2 extends in the second direction Y. The second power signal line PVDD2 is disposed in the same layer as the layer where the data line DATA and the second connection line 42 are disposed. The second power signal line PVDD2 and the data line DATA are in the same layer. The second power signal line PVDD2 and the second connection line 42 are in the same layer. An area where the pixel driving circuit 20 is located is a pixel area P. In the same pixel area P, the second connection line 42 is located on a side, away from the via 61 (for example, the fourth node N4), of the second power signal line PVDD2 in the first direction X. Since the via 61 at the fourth node N4 occupies a certain space, it is not easy to set the second connection line 42 between the data line DATA and the via 61 at the fourth node N4. In embodiments of the present disclosure, the second connection line 42 is disposed on a side, away from the via 61 at the fourth node N4, of the second power signal line PVDD2, thereby avoiding undesirable electrical connection between the second connection line 42 and the fourth node N4.

In an exemplary embodiment, referring to FIGS. 24 to 26, the power signal line PVDD includes a first power signal line PVDD1 and a second power signal line PVDD2 electrically connected to the first power signal line PVDD1. The first power signal line PVDD1 extends in the first direction X. The second power signal line PVDD2 extends in the second direction Y. The second power signal line PVDD2 and the data line DATA are in the same layer. The second connection line 42 is disposed in the layer different from the layer where the second power signal line PVDD2 is disposed. In the direction perpendicular to the plane where the substrate 10 is located, the second connection line 42 and the second power signal line PVDD2 overlap, reducing the common light-shading area of the second connection line 42 and the second power signal line PVDD2, and increasing the transmittance.

In an exemplary embodiment, referring to FIGS. 11 to 14, the second power signal line PVDD2 includes a second power signal line body portion 81 and a second power signal line extension portion 82. The extension direction of the second power signal line body portion 81 and the extension direction of the second power signal line extension portion 82 intersect each other. In the second direction Y, the semiconductor layer located between the first scan signal line S1 and the second scan signal line S2 is denoted as a first node semiconductor layer 2021. The first node semiconductor layer 2021 is a semiconductor layer at the position of the first node N1. The second power signal line extension portion 82 and the first node semiconductor layer 2021 are in different layers. In the direction perpendicular to the plane where the substrate 10 is located, the second power signal line extension portion 82 and the first node semiconductor layer 2021 overlap. The second power signal line extension portion 82 transmits a constant voltage. The second power signal line extension portion 82 and the first node semiconductor layer 2021 overlap so that the second power signal line extension portion 82 can act as a shielding layer to shield electromagnetic interferences generated by other layers to the first node semiconductor layer 2021, thereby reducing voltage disturbances of the first node N1.

Exemplarily, referring to FIGS. 11 to 14, the extension direction of the second power signal line PVDD2 is the same as the extension direction of the second power signal line body portion 81. The second power signal line PVDD2 extends in the second direction Y. The second power signal line body portion 81 extends in the second direction Y. The second power signal line extension portion 82 extends in the first direction X. The second power signal line extension portion 82 is a convex portion on the second power signal line PVDD2 in an XY plane. The XY plane is the plane formed by the first direction X and the second direction Y.

Exemplarily, referring to FIGS. 18 and 19, the extension direction of the second power signal line PVDD2 is the same as the extension direction of the second power signal line body portion 81. The second power signal line PVDD2 extends in the first direction X. The second power signal line body portion 81 extends in the first direction X. The second power signal line extension portion 82 extends in the second direction Y.

In an exemplary embodiment, referring to FIGS. 11 to 14, the first connection line 41 is electrically connected to the data line DATA through the via 61. The array plate further includes a dummy via 62. The dummy via 62 is located at an intersection of the first connection line 41 and the data line DATA. That is, at the intersection of the first connection line 41 and the data line DATA, the first connection line 41 does not need to be electrically connected to the data line DATA, and the via 61 is not set, but the dummy via 62 is set. Different from the via 61, the dummy via 62 is only set on the corresponding metal layer, and not set on the organic layer or the inorganic layer. Thus, the film thickness at the position where the dummy via 62 is located is consistent with the film thickness at the position where the via 61 is located coincide, thereby improving the thickness uniformity of the array substrate at each position.

Figure 35:
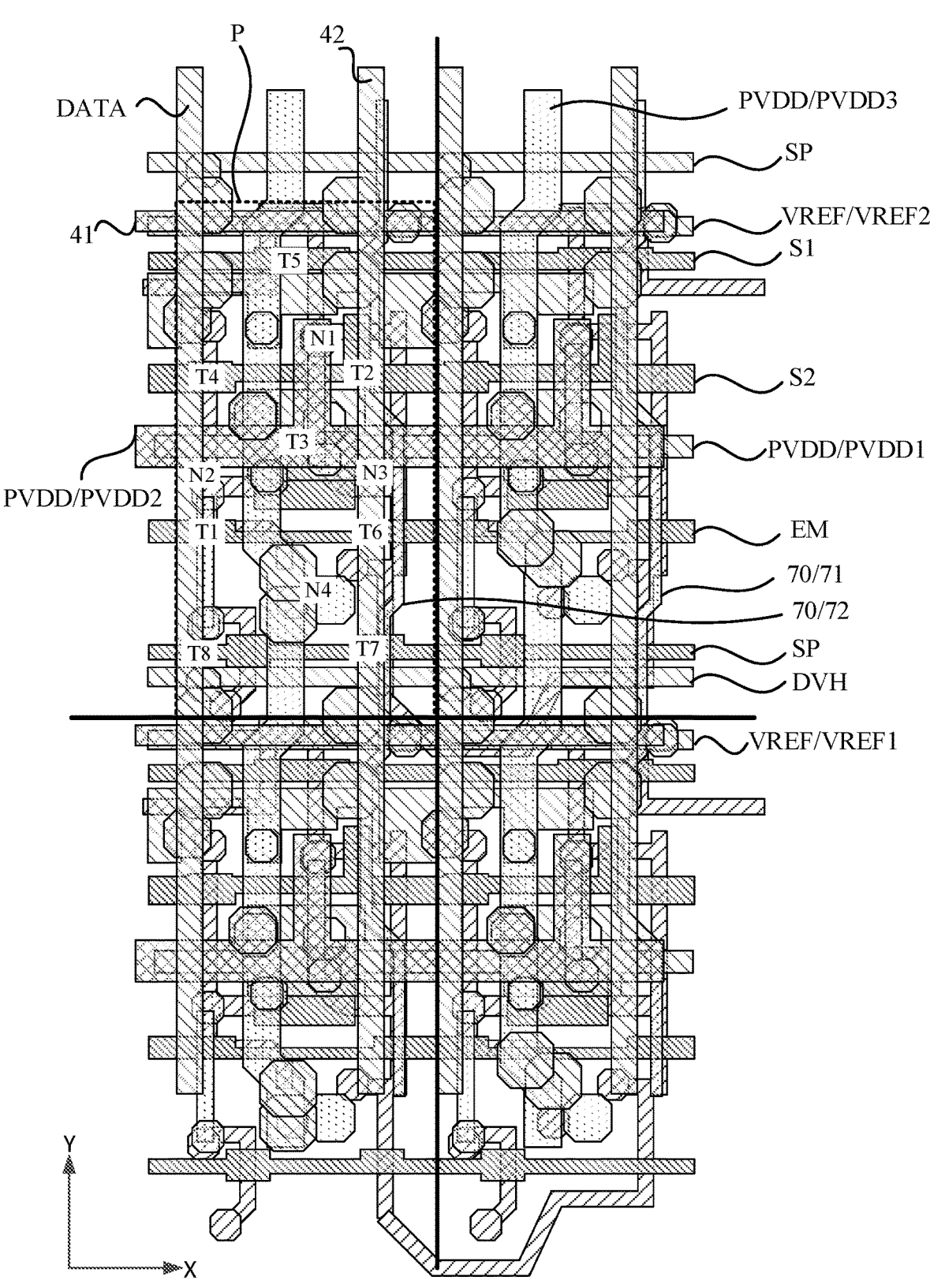
FIG. 35 is a top view of another pixel driving circuit according to an embodiment of the present disclosure.
Figure 36:
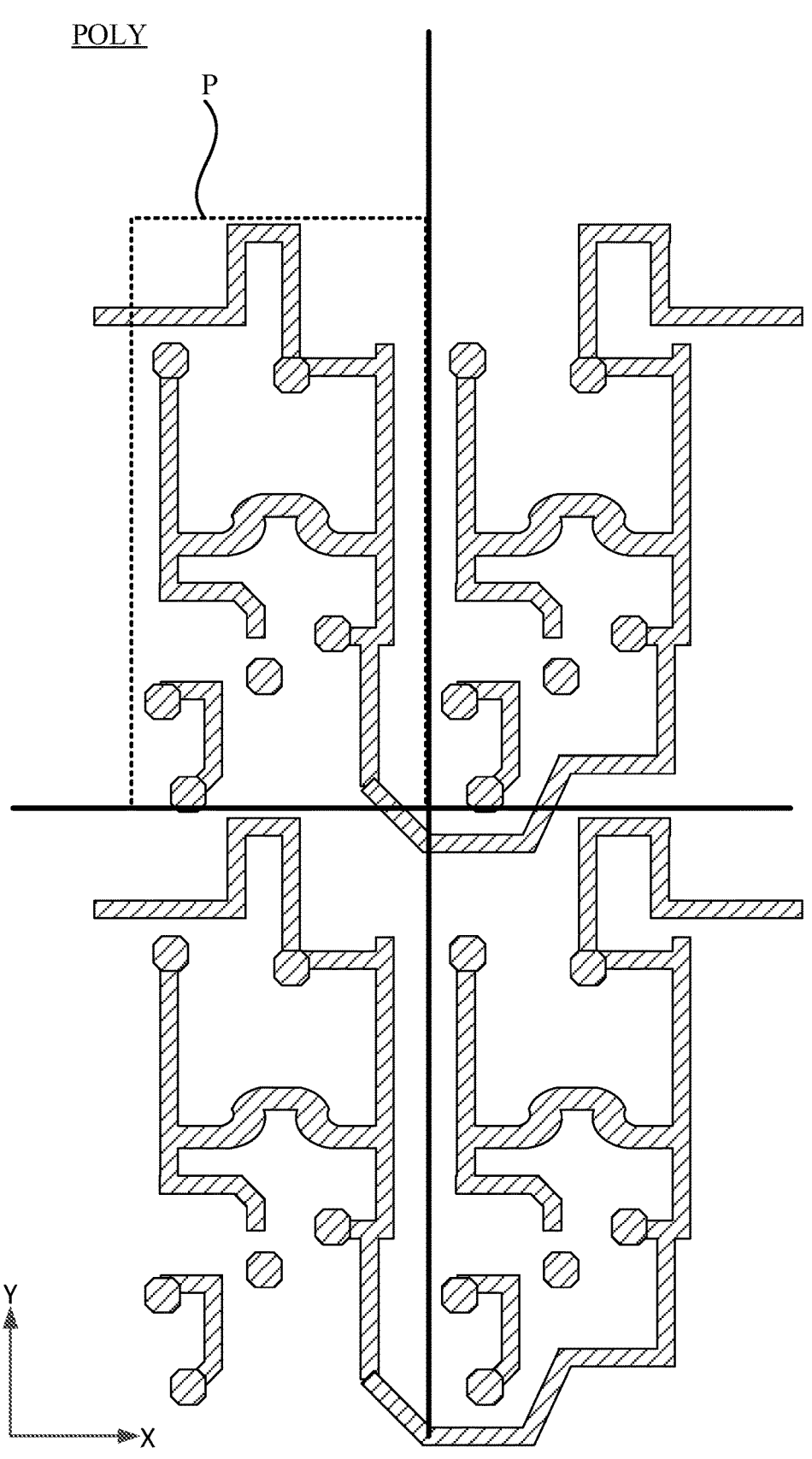
FIG. 36 is a top view of another silicon semiconductor layer according to an embodiment of the present disclosure.
Figure 37:
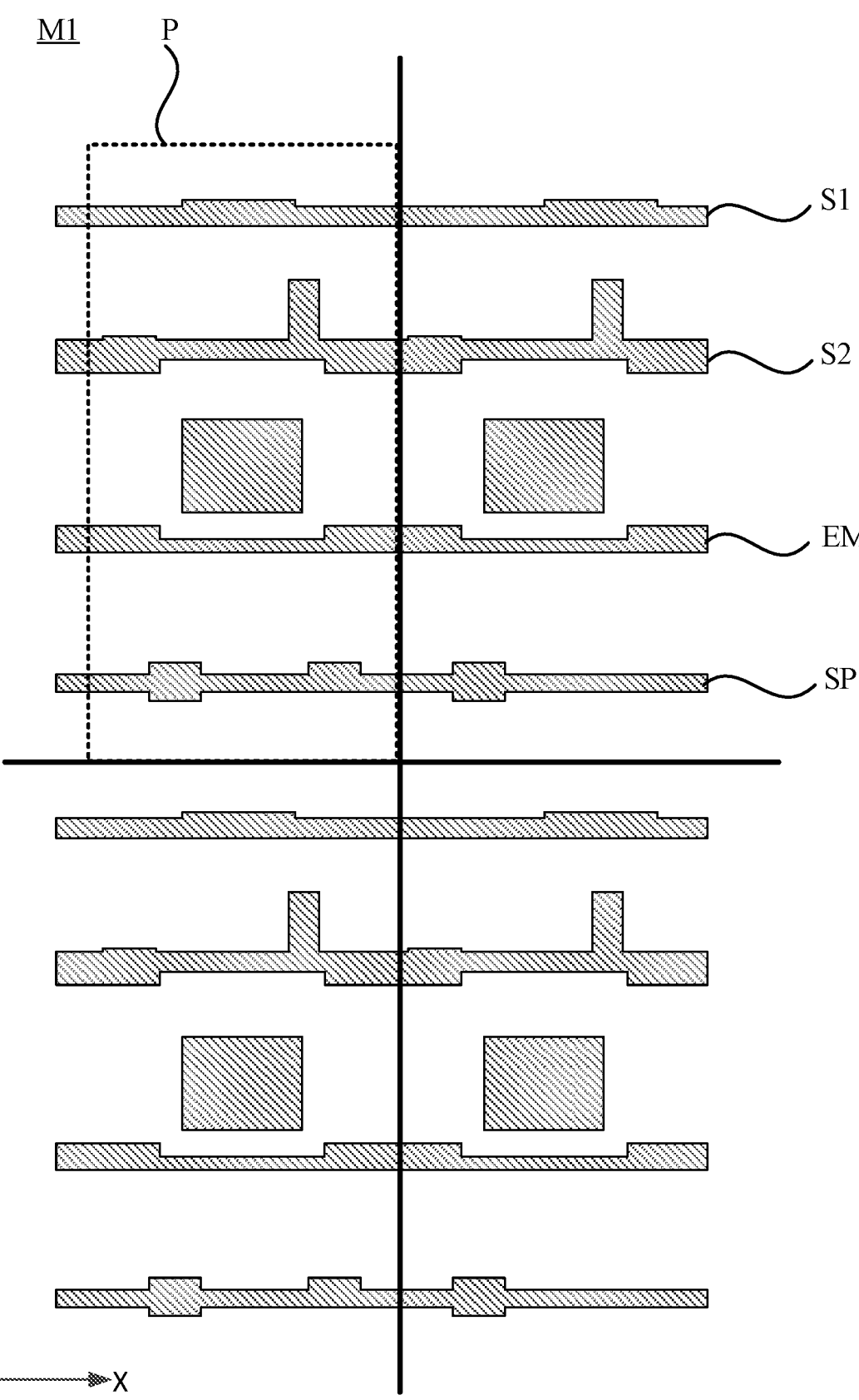
FIG. 37 is a top view of another first metal layer according to an embodiment of the present disclosure.
Figure 38:
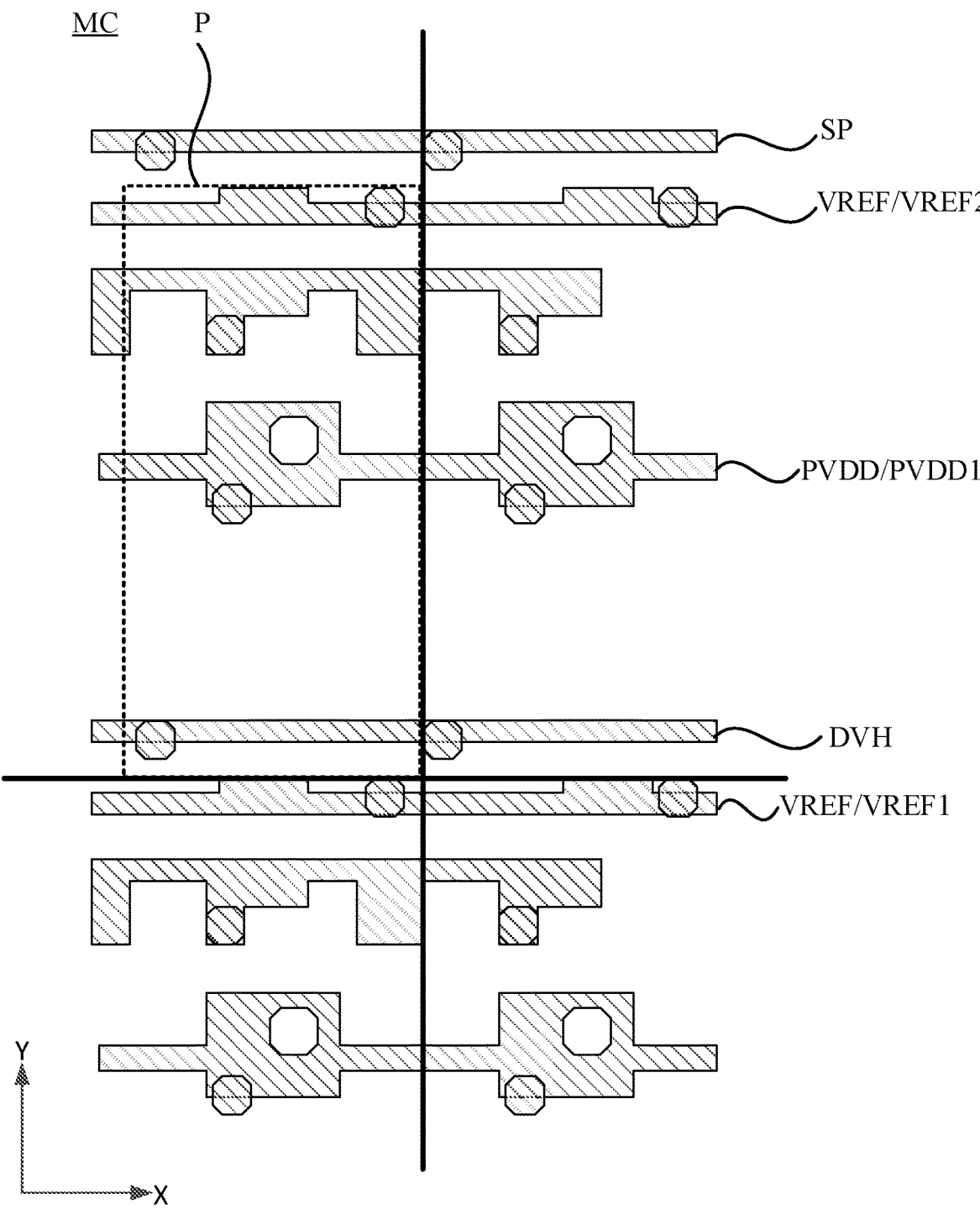
FIG. 38 is a top view of another capacitor metal layer according to an embodiment of the present disclosure.
Figure 39:
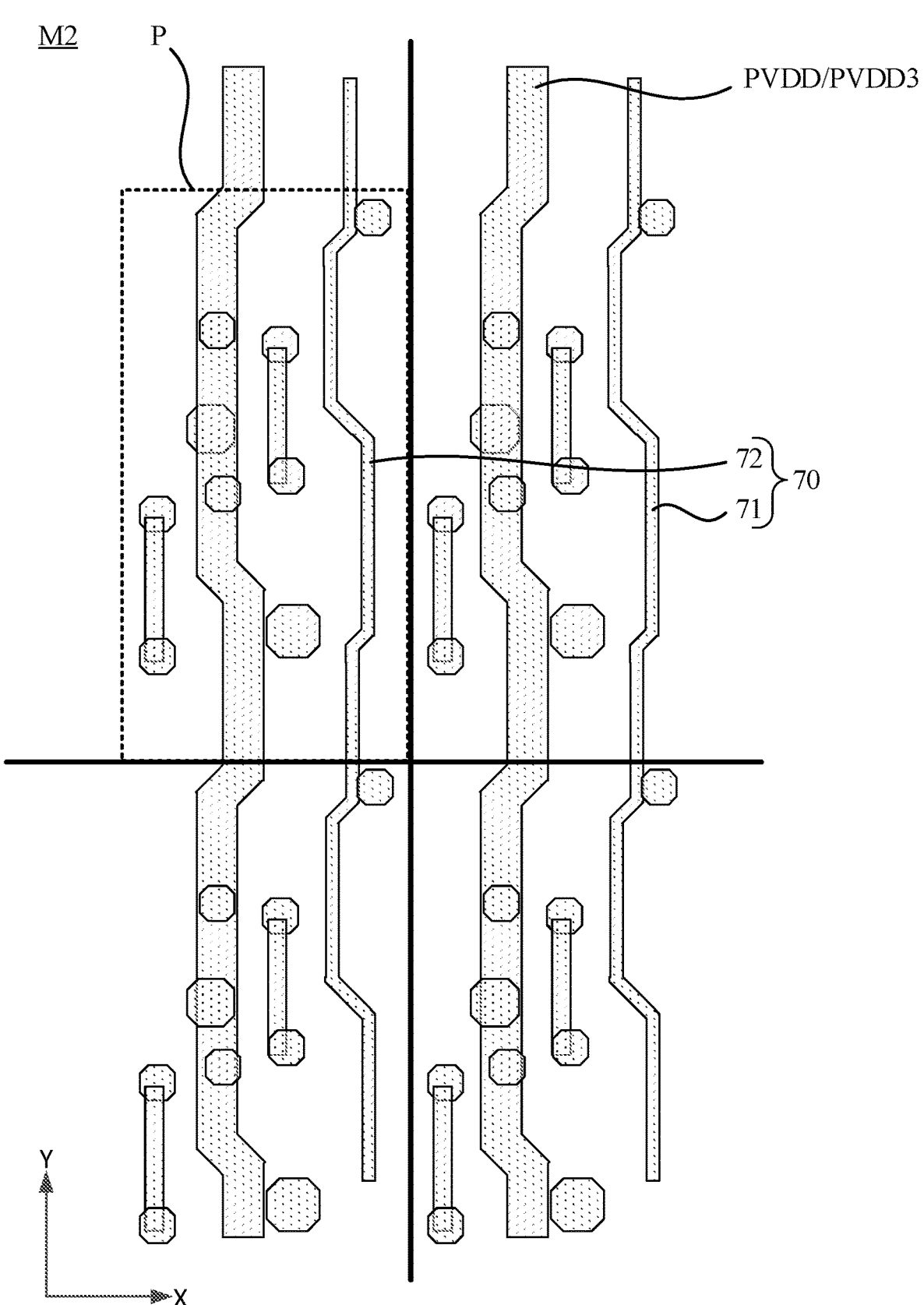
FIG. 39 is a top view of another second metal layer according to an embodiment of the present disclosure.
Figure 40:
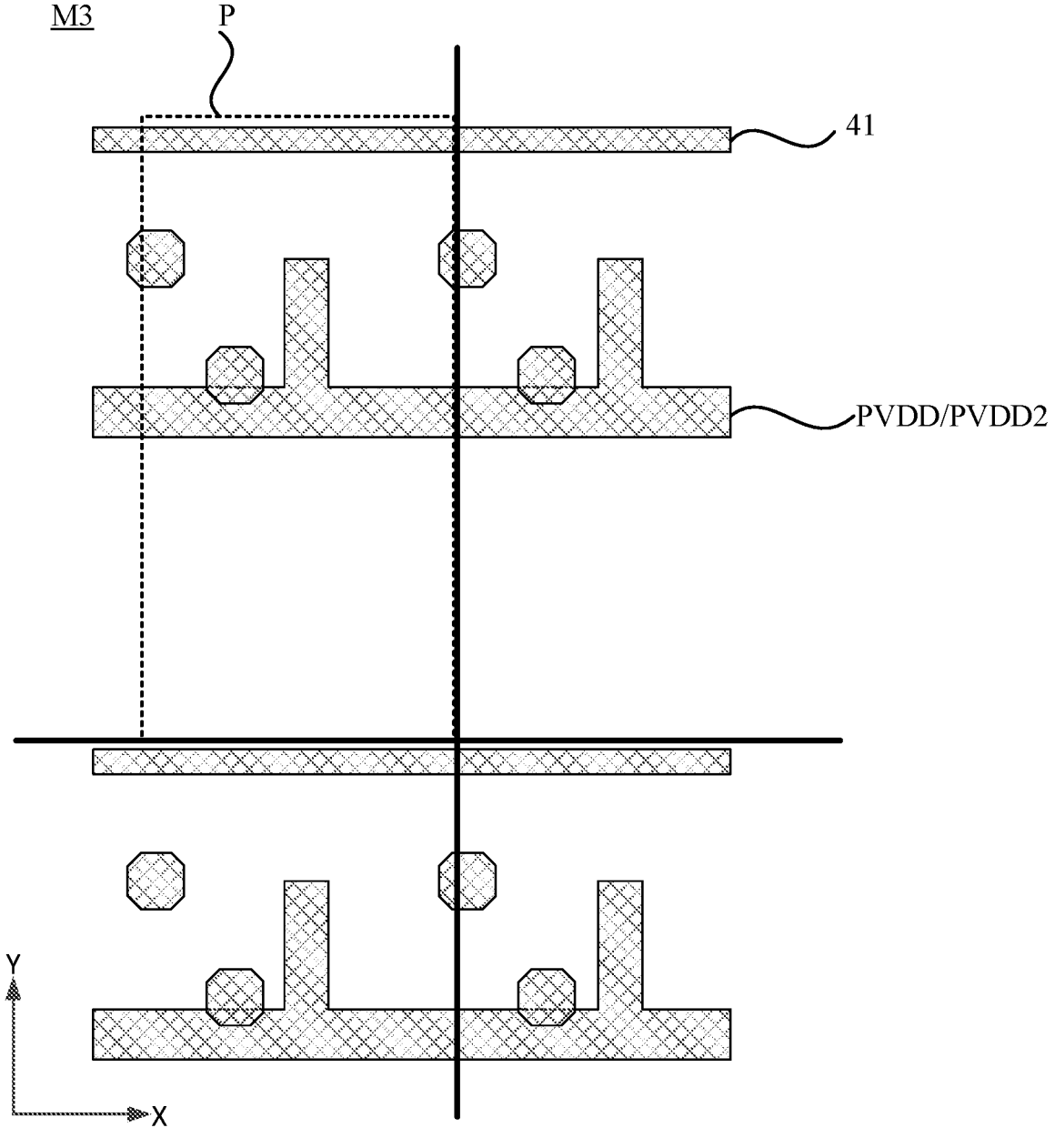
FIG. 40 is a top view of another third metal layer according to an embodiment of the present disclosure.
Figure 41:
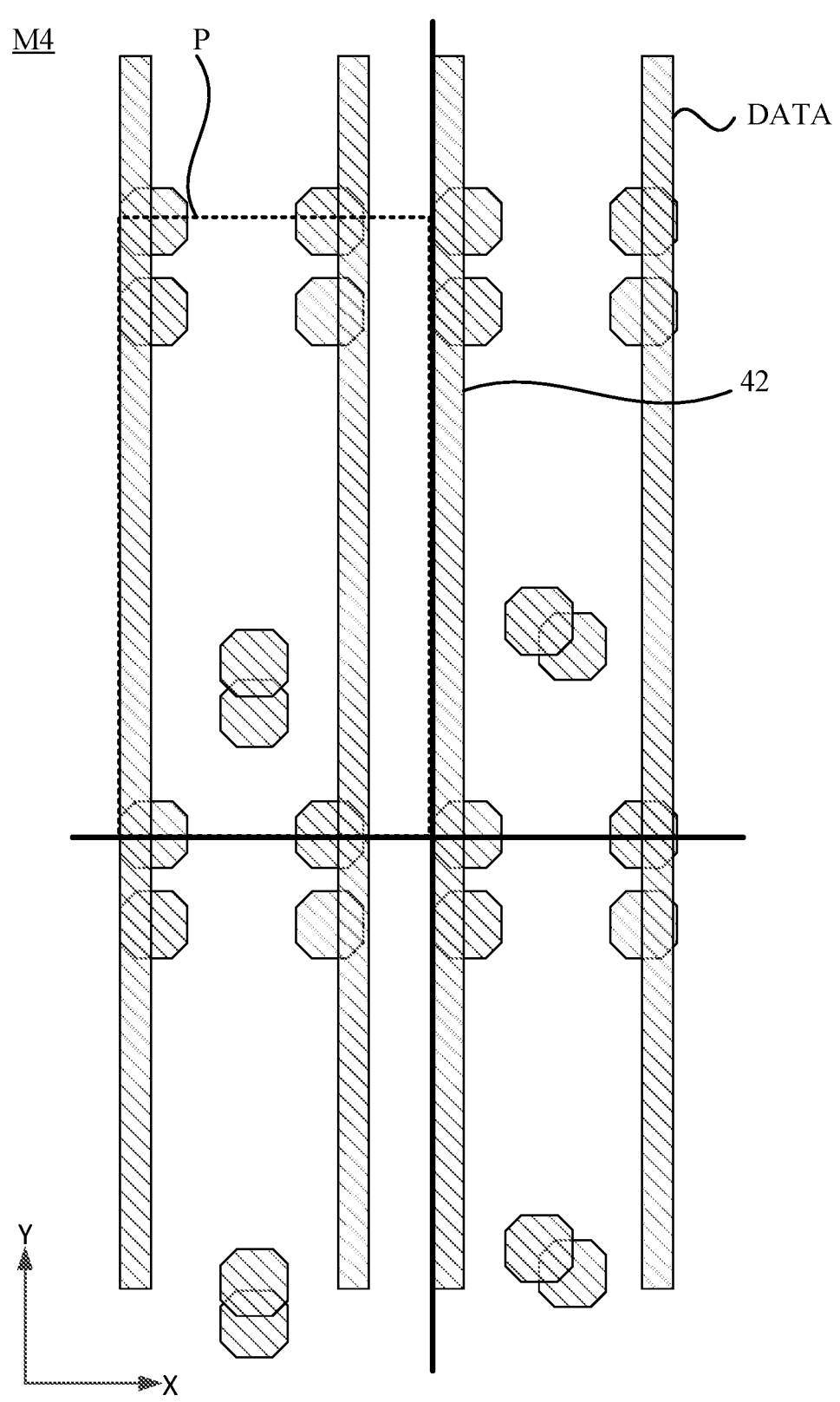
FIG. 41 is a top view of another fourth metal layer according to an embodiment of the present disclosure.

It is to be noted that, in some embodiments, the regulating signal line DVH may also extend in the first direction X. FIG. 35 is a top view of another pixel driving circuit according to an embodiment of the present disclosure. FIG. 36 is a top view of another silicon semiconductor layer according to an embodiment of the present disclosure. FIG. 37 is a top view of another first metal layer according to an embodiment of the present disclosure. FIG. 38 is a top view of another capacitor metal layer according to an embodiment of the present disclosure. FIG. 39 is a top view of another second metal layer according to an embodiment of the present disclosure. FIG. 40 is a top view of another third metal layer according to an embodiment of the present disclosure. FIG. 41 is a top view of another fourth metal layer according to an embodiment of the present disclosure. FIG. 35 is a top view of a pixel driving circuit formed by stacking layers of FIGS. 36 to 41. The regulating signal line DVH extends in the first direction X. The regulating signal line DVH is located in the capacitor metal layer MC. The regulating signal line DVH and the reset signal line VREF are disposed in the same layer. In other embodiments, the regulating signal line DVH extending in the first direction X may also be disposed in another layer and is not limited in embodiments of the present disclosure. It is to be noted that when the regulating signal line DVH extends in the first direction X, the arrangement of the signal lines 30, the power signal lines PVDD, the first connection lines 41 and the second connection lines 42 are also applicable, and details are not described herein again.

Figure 42:
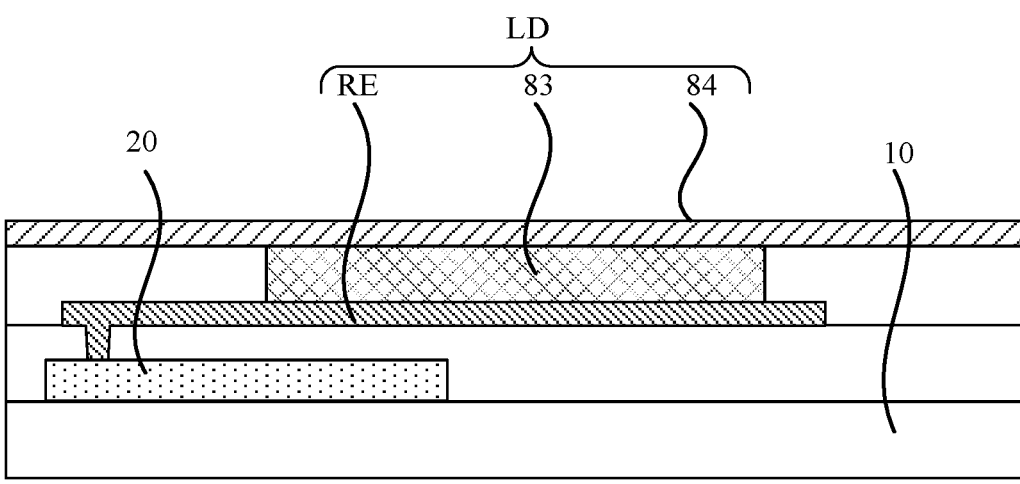
FIG. 42 is a sectional view of a display panel according to an embodiment of the present disclosure.

FIG. 42 is a sectional view of a display panel according to an embodiment of the present disclosure. Referring to FIGS. 1, 2, and 42, the display panel includes the array substrate of any one of the preceding embodiments and multiple light-emitting elements LD disposed on the array substrate (FIG. 42 exemplarily shows one light-emitting element LD). A light-emitting element LD is electrically connected to a pixel driving circuit 20. The light-emitting element LD is configured to emit light under the driving of the pixel driving circuit 20.

Exemplarily, referring to FIGS. 1, 2, and 42, the light-emitting element LD includes an anode RE, a light-emitting functional layer 83, and a cathode 84. The light-emitting functional layer 83 is located between the anode RE and the cathode 84. The light-emitting functional layer 83 may include at least one of an organic light-emitting material or an inorganic light-emitting material. The cathode 84 is electrically connected to a power-supply line PVEE.

Figure 43:
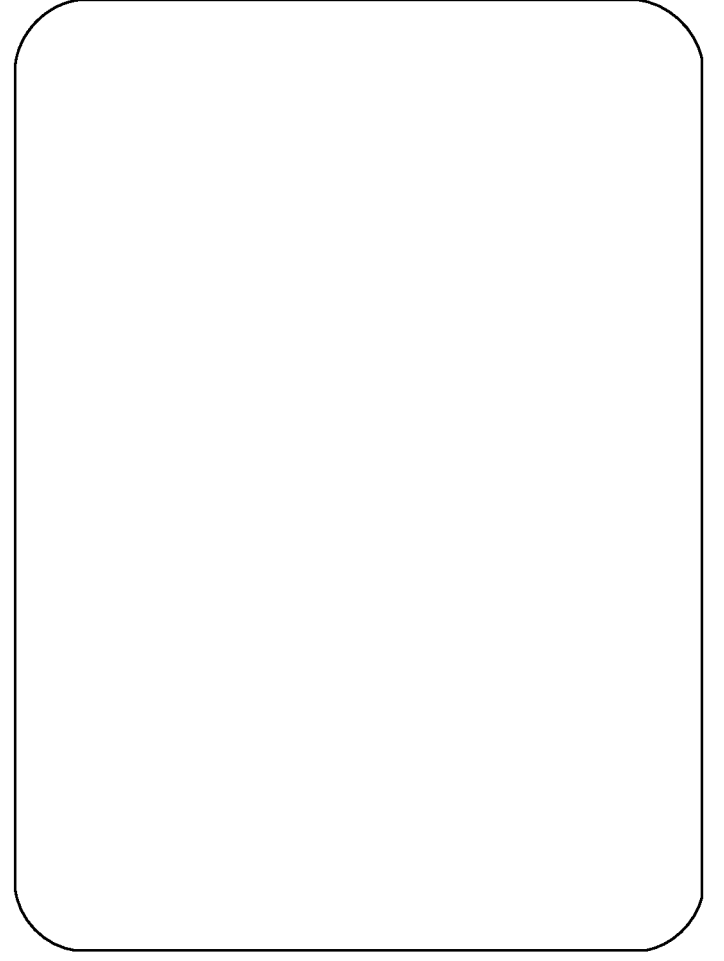
FIG. 43 is a schematic diagram of a display device according to an embodiment of the present disclosure.

FIG. 43 is a schematic diagram of a display device according to an embodiment of the present disclosure. Referring to FIG. 43, the display device includes the display panel in the preceding embodiment. The display device provided by embodiment of the present disclosure may be a phone or any electronic product having a display function including but not limited to: a television, a notebook computer, a desktop display, a tablet computer, a digital camera, a smart bracelet, smart glasses, an in-vehicle display, medical equipment, industrial control equipment, a touch interactive terminal and is not particularly limited in the embodiment of the present disclosure.

It is to be noted that the preceding are only preferred embodiments of the present disclosure and technical principles used therein. It is to be understood by those skilled in the art that the present disclosure is not limited to the embodiments described herein. Those skilled in the art can make various apparent modifications, adaptations, combinations, and substitutions without departing from the scope of the present disclosure. Therefore, while the present disclosure has been described in detail through the preceding embodiment, the present disclosure is not limited to the preceding embodiment and may include more other equivalent embodiments without departing from the concept of the present disclosure. The scope of the present disclosure is determined by the scope of the appended claims.

What is claimed is:

1. An array substrate, comprising: a substrate, a plurality of pixel driving circuits, and a plurality of signal lines, wherein the plurality of pixel driving circuits and the plurality of signal lines are located on a same side of the substrate;

a pixel driving circuit of the plurality of pixel driving circuits comprises a drive transistor and a regulating transistor, the plurality of signal lines comprise a scan signal line, a regulating signal line, and a power signal line, and the scan signal line comprises a regulating control signal line;

a first electrode of the drive transistor is electrically connected to the power signal line;

a first electrode of the regulating transistor is electrically connected to the regulating signal line, a second electrode of the regulating transistor is electrically connected to the first electrode of the drive transistor or a second electrode of the drive transistor, and a gate of the regulating transistor is electrically connected to the regulating control signal line;

the scan signal line extends in a first direction, the regulating signal line extends in a second direction, the regulating signal line is disposed in a layer different from a layer where the scan signal line is disposed, and the first direction and the second direction intersect each other;

the plurality of signal lines further comprise a data line extending in the second direction; and the pixel driving circuit further comprises a data write transistor, wherein a first electrode of the data write transistor is electrically connected to the data line, and a second electrode of the data write transistor is electrically connected to the first electrode of the drive transistor.

2. The array substrate of claim 1, further comprising: connection lines comprising a first connection line and a second connection line, wherein the first connection line is electrically connected to the second connection line, the first connection line extends in the first direction, and the second connection line extends in the second direction; and the first connection line connects the data line and the second connection line, and the first connection line is disposed in a layer different from a layer where the data line is disposed and a layer where the regulating signal line is disposed.

3. The array substrate of claim 2, wherein the second connection line is disposed in a layer same as the layer where the data line is disposed.

4. The array substrate of claim 3, wherein a layer where the first connection line is disposed is located between the layer where the data line is disposed and the substrate.

5. The array substrate of claim 4, wherein the layer where the first connection line is disposed is located between the layer where the regulating signal line is disposed and the substrate.

6. The array substrate of claim 5, wherein the plurality of signal lines further comprise a reset signal line extending in the first direction, wherein a layer where the reset signal line is disposed is located between the layer where the scan signal line is disposed and the layer where the regulating signal line is disposed; and the first connection line is disposed in a layer same as the layer where the reset signal line is disposed.

7. The array substrate of claim 6, wherein the scan signal line further comprises a light-emitting control scan signal line;

the pixel driving circuit further comprises a power write transistor;

a first electrode of the power write transistor is electrically connected to the power signal line, a second electrode of the power write transistor is electrically connected to the first electrode of the drive transistor, and a gate of the power write transistor is electrically connected to the light-emitting control scan signal line; and an area where the pixel driving circuit is disposed is a pixel area, and in a same pixel area, the first connection line is located between the reset signal line and the light-emitting control scan signal line.

8. The array substrate of claim 5, further comprising: a first jumper, wherein the first jumper is disposed in a layer different from both the layer where the data line is disposed and the layer where the first connection line is disposed, a first terminal of the first jumper is electrically connected to the data line through a via, and a second terminal of the first jumper is electrically connected to the first connection line through the via.

9. The array substrate of claim 8, wherein the first jumper is disposed in a layer same as the layer where the regulating signal line is disposed.

10. The array substrate of claim 4, wherein the layer where the first connection line is disposed is located on a side of the layer where the regulating signal line is disposed, which faces away from the substrate.

11. The array substrate of claim 10, wherein the layer where the first connection line is disposed is located between the layer where the regulating signal line is disposed and the layer where the data line is disposed.

12. The array substrate of claim 3, wherein a layer where the first connection line is disposed is on a side of the layer where the data line is disposed, which faces away from the substrate.

13. The array substrate of claim 3, wherein the power signal line comprises a first power signal line and a second power signal line, wherein the first power signal line is electrically connected to the second power signal line, the first power signal line extends in the first direction, the second power signal line extends in the second direction, and the second power signal line is disposed in a layer same as the layer where the data line is disposed and a layer where the second connection line is disposed;

the scan signal line further comprises a light-emitting control scan signal line; the pixel driving circuit further comprises a light-emitting control transistor, wherein a first electrode of the light-emitting control transistor is electrically connected to the second electrode of the drive transistor, a second electrode of the light-emitting control transistor is electrically connected to a light-emitting element through a via, and a gate of the light-emitting control transistor is electrically connected to the light-emitting control scan signal line; and an area where the pixel driving circuit is located is a pixel area, and in a same pixel area, in the first direction, the second connection line is located on a side of the second power signal line, which faces away from the substrate.

14. The array substrate of claim 2, wherein the second connection line is disposed in a layer different from the layer where the data line is disposed.

15. The array substrate of claim 14, wherein a layer where the second connection line is disposed is located on a side of the layer where the data line is disposed, which faces away from the substrate.

16. The array substrate of claim 14, wherein the first connection line is disposed in a layer same as the layer where the second connection line is disposed.

17. The array substrate of claim 14, wherein the power signal line comprises a first power signal line and a second power signal line, wherein the first power signal line is electrically connected to the second power signal line, the first power signal line extends in the first direction, the second power signal line extends in the second direction, and the second power signal line is disposed in a layer same as the layer where the data line is disposed; and in a direction perpendicular to a plane where the substrate is located, the second connection line and the second power signal line overlap.

18. The array substrate of claim 2, wherein the layer where the regulating signal line is disposed is located between a layer where the second connection line is disposed and the substrate, and is located between the layer where the data line is disposed and the substrate.

19. The array substrate of claim 2, wherein the regulating signal line is disposed in a layer same as a layer where the second connection line is disposed and the layer where the data line is disposed.

20. The array substrate of claim 2, wherein the regulating signal line is disposed in a layer same as the layer where the data line is disposed, and the layer where the regulating signal line is disposed is located between a layer where the second connection is disposed and the substrate.

21. The array substrate of claim 2, wherein the regulating signal line is located on a side of the data line, which faces away from the substrate; and the second connection line is disposed in a layer same as the layer where the data line is disposed.

22. The array substrate of claim 2, wherein the plurality of signal lines further comprise a reset signal line extending in the first direction, wherein a layer where the reset signal line is disposed is located between the layer where the scan signal line is disposed and the layer where the regulating signal line is disposed; and in a direction perpendicular to a plane where the substrate is located, the first connection line is disposed in a layer different from the layer where the reset signal line is disposed, and the first connection line and the reset signal line at least partially overlap.

23. The array substrate of claim 2, wherein the plurality of signal lines further comprise an auxiliary reset signal line extending in the second direction, wherein the auxiliary reset signal line is disposed in a layer same as the layer where the regulating signal line is disposed; and in a direction perpendicular to a plane where the substrate is located, the second connection line is disposed in a layer different from a layer where the auxiliary reset signal line is disposed, and the second connection line and the auxiliary reset signal line overlap.

24. The array substrate of claim 2, wherein the regulating signal line comprises a first line segment extending in the second direction, wherein in a direction perpendicular to a plane where the substrate is located, the first line segment and the data line overlap.

25. The array substrate of claim 2, wherein in the first direction, one second connection line is disposed between two adjacent data lines, and one data line is disposed between two adjacent second connection lines.

26. The array substrate of claim 2, wherein the first connection line is electrically connected to the data line through a via; and the array substrate further comprises a dummy via, wherein the dummy via is located at an intersection of the first connection line and the data line.

27. The array substrate of claim 1, wherein the power signal line comprises a first power signal line and a second power signal line, wherein the first power signal line is electrically connected to the second power signal line, the first power signal line extends in the first direction, and the second power signal line extends in the first direction; and in a direction perpendicular to a plane where the substrate is located, the first power signal line is disposed in a layer different from a layer where the second power signal line is disposed, and the first power signal line and the second power signal line overlap.

28. The array substrate of claim 1, wherein the power signal line comprises a first power signal line and a second power signal line, wherein the first power signal line is electrically connected to the second power signal line, the first power signal line extends in the first direction, a layer where the first power signal line is disposed is located between a layer where the second power signal line is disposed and the substrate;

the second power signal line comprises a second power signal line body portion and a second power signal line extension portion, wherein an extension direction of the second power signal line body portion and an extension direction of the second power signal line extension portion intersect each other;

the plurality of signal lines further comprise a data line and a reset signal line, and the scan signal line further comprises a first scan signal line and a second scan signal line; and the pixel driving circuit further comprises a first reset transistor;

a first electrode of the first reset transistor is electrically connected to the reset signal line, a second electrode of the first reset transistor is electrically connected to a gate of the drive transistor, and a gate of the first reset transistor is electrically connected to the first scan signal line;

a gate of the data write transistor is electrically connected to the second scan signal line; and in the second direction, a semiconductor layer located between the first scan signal line and the second scan signal line is denoted as a first node semiconductor layer; and in a direction perpendicular to a plane where the substrate is located, the second power signal line extension portion is disposed in a same layer as a layer where the first node semiconductor layer is disposed, and the second power signal line extension portion and the first node semiconductor layer overlap.

29. A display panel, comprising: an array substrate and a plurality of light-emitting elements disposed on the array substrate;

wherein the array substrate comprises: a substrate, a plurality of pixel driving circuits, and a plurality of signal lines, wherein the plurality of pixel driving circuits and the plurality of signal lines are located on a same side of the substrate;

a pixel driving circuit of the plurality of pixel driving circuits comprises a drive transistor and a regulating transistor, the plurality of signal lines comprise a scan signal line, a regulating signal line, and a power signal line, and the scan signal line comprises a regulating control signal line;

a first electrode of the drive transistor is electrically connected to the power signal line;

a first electrode of the regulating transistor is electrically connected to the regulating signal line, a second electrode of the regulating transistor is electrically connected to the first electrode of the drive transistor or a second electrode of the drive transistor, and a gate of the regulating transistor is electrically connected to the regulating control signal line;

the scan signal line extends in a first direction, the regulating signal line extends in a second direction, the regulating signal line is disposed in a layer different from a layer where the scan signal line is disposed, and the first direction and the second direction intersect each other;

the plurality of signal lines further comprise a data line extending in the second direction; and the pixel driving circuit further comprises a data write transistor, wherein a first electrode of the data write transistor is electrically connected to the data line, and a second electrode of the data write transistor is electrically connected to the first electrode of the drive transistor.

30. A display device, comprising: a display panel, wherein the display panel comprises: an array substrate and a plurality of light-emitting elements disposed on the array substrate;

wherein the array substrate comprises: a substrate, a plurality of pixel driving circuits, and a plurality of signal lines, wherein the plurality of pixel driving circuits and the plurality of signal lines are located on a same side of the substrate;

a pixel driving circuit of the plurality of pixel driving circuits comprises a drive transistor and a regulating transistor, the plurality of signal lines comprise a scan signal line, a regulating signal line, and a power signal line, and the scan signal line comprises a regulating control signal line;

a first electrode of the drive transistor is electrically connected to the power signal line;

a first electrode of the regulating transistor is electrically connected to the regulating signal line, a second electrode of the regulating transistor is electrically connected to the first electrode of the drive transistor or a second electrode of the drive transistor, and a gate of the regulating transistor is electrically connected to the regulating control signal line;

the scan signal line extends in a first direction, the regulating signal line extends in a second direction, the regulating signal line is disposed in a layer different from a layer where the scan signal line is disposed, and the first direction and the second direction intersect each other;

the plurality of signal lines further comprise a data line extending in the second direction; and the pixel driving circuit further comprises a data write transistor, wherein a first electrode of the data write transistor is electrically connected to the data line, and a second electrode of the data write transistor is electrically connected to the first electrode of the drive transistor.

* * * * *